United States Patent
Kawamoto et al.

(10) Patent No.: US 11,277,001 B2
(45) Date of Patent: Mar. 15, 2022

(54) POWER FEED CONTROL DEVICE

(71) Applicant: Panasonic Intellectual Property Management Co., Ltd., Osaka (JP)

(72) Inventors: Takashi Kawamoto, Mie (JP); Takao Akioka, Mie (JP); Naoki Fukuo, Shiga (JP); Shinichi Nakamura, Mie (JP); Masahiko Kimura, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 434 days.

(21) Appl. No.: 16/477,501

(22) PCT Filed: Jan. 29, 2018

(86) PCT No.: PCT/JP2018/002605
§ 371 (c)(1),
(2) Date: Jul. 11, 2019

(87) PCT Pub. No.: WO2018/143109
PCT Pub. Date: Aug. 9, 2018

(65) Prior Publication Data
US 2019/0372335 A1    Dec. 5, 2019

(30) Foreign Application Priority Data
Jan. 31, 2017 (JP) .............................. JP2017-015759

(51) Int. Cl.
| | |
|---|---|
| *H02H 7/18* | (2006.01) |
| *H02J 7/00* | (2006.01) |
| *H05K 1/18* | (2006.01) |
| *H05K 5/00* | (2006.01) |
| *H05K 5/02* | (2006.01) |

(Continued)

(52) U.S. Cl.
CPC ................. *H02H 7/18* (2013.01); *H02J 7/00* (2013.01); *H02J 7/0045* (2013.01); *H05K 1/181* (2013.01);
(Continued)

(58) Field of Classification Search
CPC .... H05K 1/18; H05K 1/181–187; H05K 5/00; H05K 5/02; H05K 5/0014–0017;
(Continued)

(56) References Cited

U.S. PATENT DOCUMENTS

| | | | |
|---|---|---|---|
| 8,541,978 B2* | 9/2013 | Fukuo | ....................... B60L 3/04 320/109 |
| 2011/0148355 A1 | 6/2011 | Nakamura et al. | |

(Continued)

FOREIGN PATENT DOCUMENTS

| | | |
|---|---|---|
| DE | 102015002704 A1 | 9/2016 |
| EP | 2 423 028 A2 | 2/2012 |

(Continued)

OTHER PUBLICATIONS

International Search Report and Written Opinion issued in corresponding International Patent Application No. PCT/JP2018/002605, dated Feb. 27, 2018, with partial English translation.

*Primary Examiner* — Tuan T Dinh
(74) *Attorney, Agent, or Firm* — McDermott Will and Emery LLP

(57) ABSTRACT

A body of a power feed control device includes a housing recess to house a module including a holder, the first sub-bus bar, the second sub-bus bar, the third sub-bus bar, and a zero-phase-sequence current transformer. Lengths of respective extended pieces of the first sub-bus bar, the second sub-bus bar, and the third sub-bus bar are different from each other. The holder includes a rod portion, a post portion, and an extended portion. The extended portion covers the respective extended pieces of the first sub-bus bar, the second sub-bus bar, and the third sub-bus bar.

15 Claims, 16 Drawing Sheets

(51) Int. Cl.
  *B60L 53/60* (2019.01)
  *B60K 6/28* (2007.10)
(52) U.S. Cl.
  CPC ......... *H05K 5/0017* (2013.01); *H05K 5/0047* (2013.01); *H05K 5/0247* (2013.01); *B60K 6/28* (2013.01); *B60L 53/60* (2019.02); *B60Y 2200/91* (2013.01); *B60Y 2200/92* (2013.01); *B60Y 2300/91* (2013.01); *H05K 5/0008* (2013.01); *H05K 2201/1003* (2013.01); *H05K 2201/10053* (2013.01); *H05K 2201/10272* (2013.01)

(58) Field of Classification Search
  CPC ... H05K 5/0247; Y02T 10/70; Y02T 10/7072; B60L 3/00; B60L 11/18; H02H 3/16; H02J 7/00
  USPC .............. 361/42, 46, 52, 752–753, 807–810, 361/775–777; 320/109–115; 439/76.2
  See application file for complete search history.

(56) References Cited

U.S. PATENT DOCUMENTS

2013/0294040 A1* 11/2013 Fukumasu ............. H02K 11/33
                                                                361/752
2014/0292273 A1   10/2014 Inagaki et al.

FOREIGN PATENT DOCUMENTS

JP      2011-135653 A     7/2011
JP      2014-195339 A    10/2014

* cited by examiner

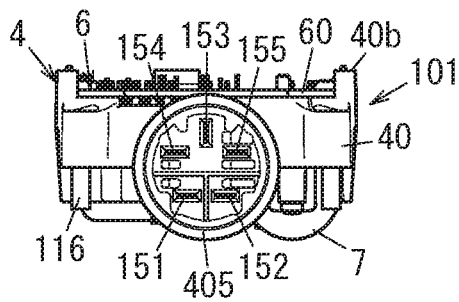
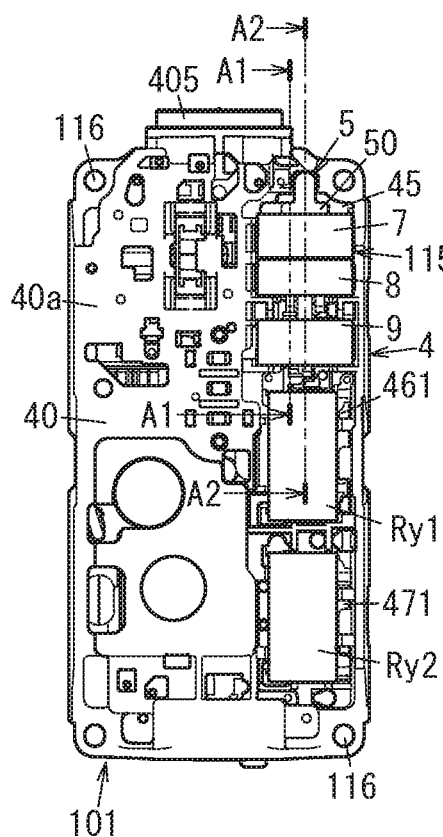
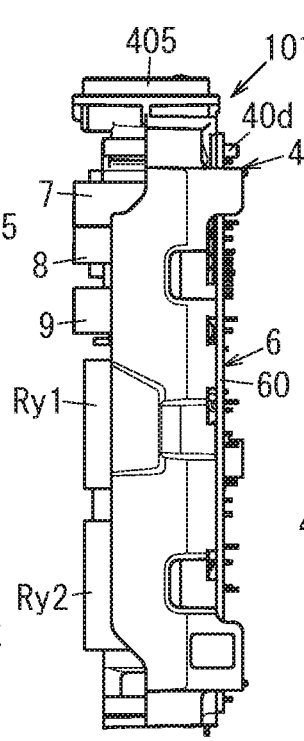
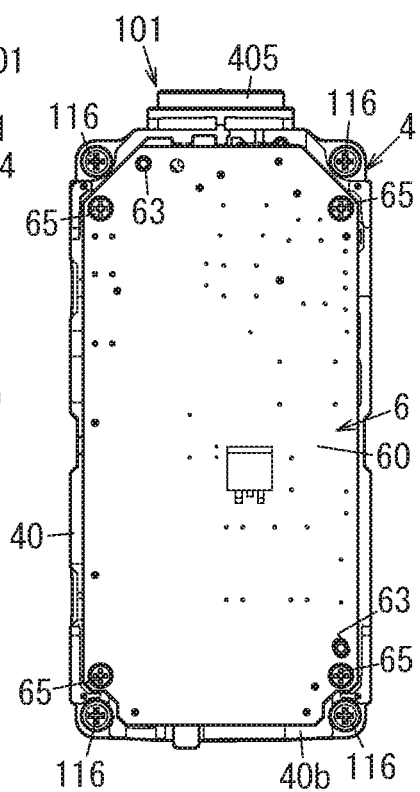
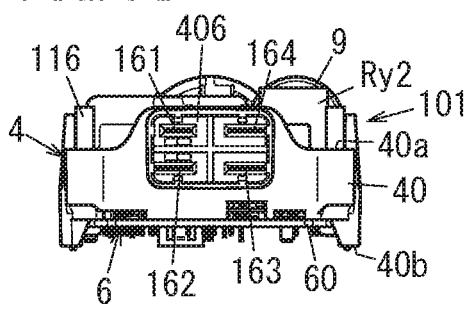

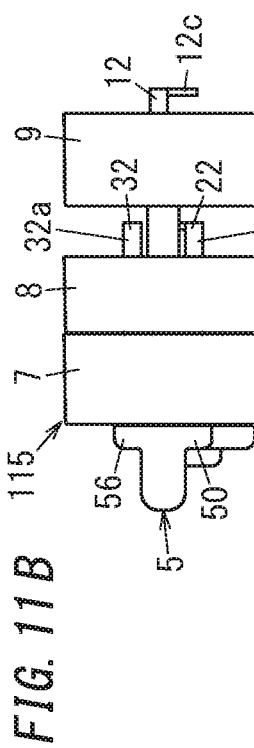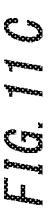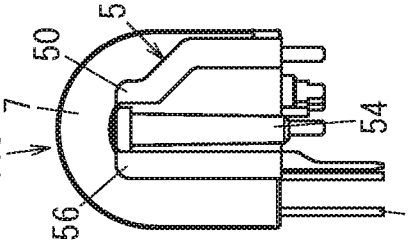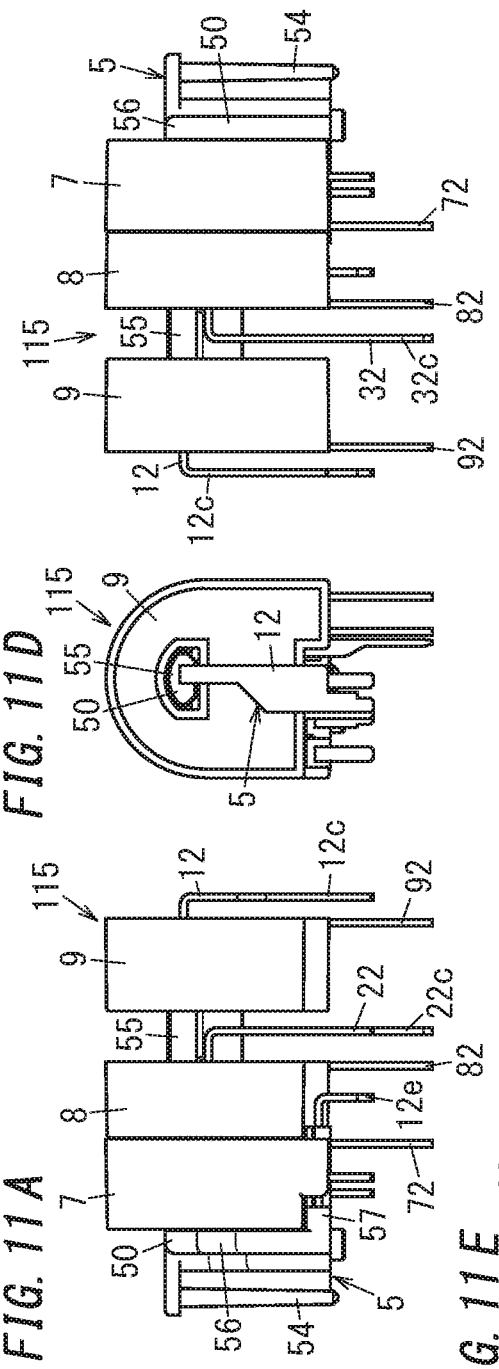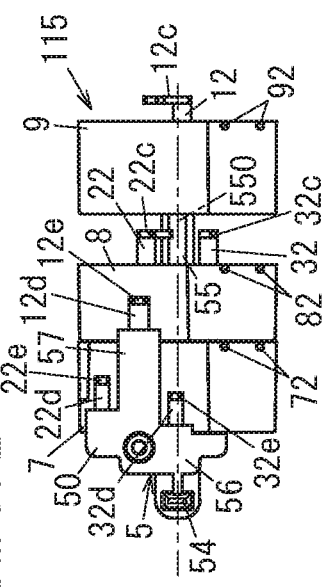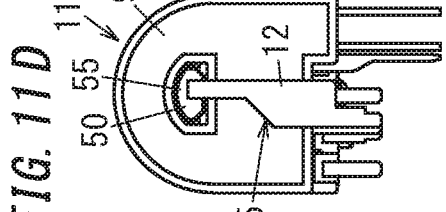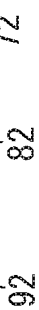

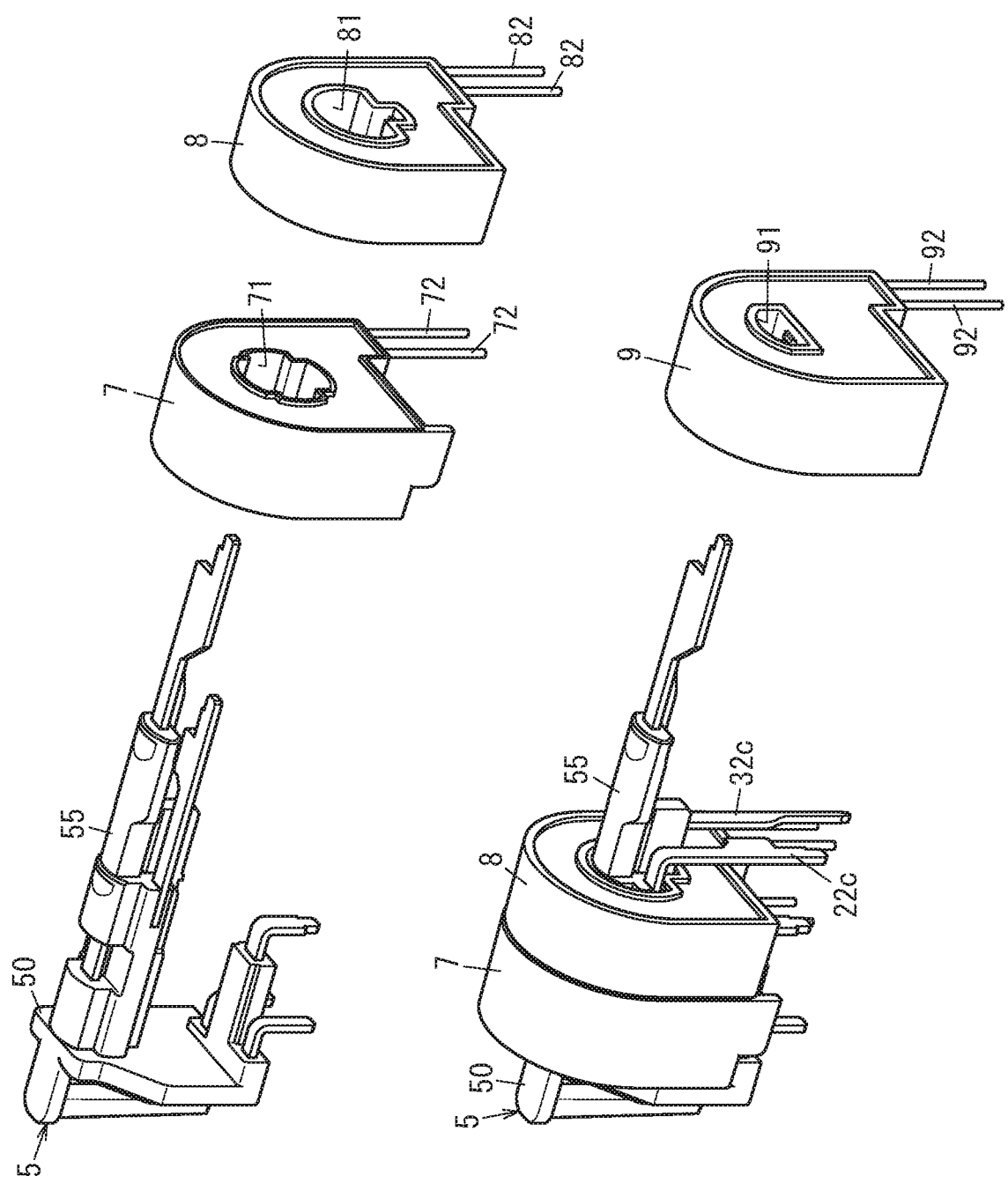

POWER FEED CONTROL DEVICE

CROSS-REFERENCE OF RELATED APPLICATIONS

This application is the U.S. National Phase under 35 U.S.C. § 371 of International Patent Application No. PCT/JP2018/002605, filed on Jan. 29, 2018, which in turn claims the benefit of Japanese Application No. 2017-015759, filed on Jan. 31, 2017 the entire disclosures of which Applications are incorporated by reference herein.

TECHNICAL FIELD

The present invention generally relates to a power feed control device, and more particularly relates to a power feed control device including a zero-phase-sequence current transformer.

BACKGROUND ART

A power feed control device has been known in the art as a device for controlling feeding electricity from an external power supply to an electric vehicle or any other moving vehicle (see, for example, Patent Literature 1).

The power feed control device disclosed in Patent Literature 1 includes a set of power-receiving conductors (power-receiving bus bars for first and second electrical paths) and a set of power-feeding conductors (power-feeding bus bars for the first and second electrical paths). A single power-receiving conductor and a single power-feeding conductor are provided for each of a hot pole (L phase) and a neutral pole (N phase). The power feed control device further includes a relay for electrically connecting or disconnecting the power-receiving conductor and the power-feeding conductor to/from each other with respect to each polarity. The power feed control device further includes a control circuit for controlling the respective relays. The control circuit is implemented on a printed wiring board. The power feed control device further includes a first grounding conductor (a bus bar for a third electrical path) as a grounding pole (PE). The power feed control device further includes a set of intermediate conductors (a first sub-bus bar and a second sub-bus bar) which make electrical contact, and are conductive, with the set of power-receiving conductors, and a second grounding conductor (a third sub-bus bar) which makes electrical contact, and is conductive, with the first grounding conductor. The power feed control device further includes a first block (body), a second block (holder), and a zero-phase-sequence current transformer.

In this power feed control device, the respective power-receiving conductors, the respective power-feeding conductors, and the first grounding conductor are fixed on the first block.

In addition, in this power feed control device, the respective intermediate conductors and the second grounding conductor are formed in a U-shape and are electrically insulated from each other by being insert-molded into the second block.

The zero-phase-sequence current transformer is adhered to the upper surface of the first block with a double-faced adhesive tape. In this case, the second block is combined by fitting with the first block with the zero-phase-sequence current transformer interposed between the first and second blocks.

The power feed control device may be required to improve the electrical insulation properties between respective lead pieces of the first, second, and third sub-bus bars.

CITATION LIST

Patent Literature

Patent Literature 1: JP 2014-195339 A

SUMMARY OF INVENTION

It is an object of the present invention to provide a power feed control device with the ability to improve the electrical insulation properties between respective lead pieces of the first, second, and third sub-bus bars.

A power feed control device according to an aspect of the present invention includes a first electrical path provided for a hot pole, a second electrical path provided for a neutral pole, and a third electrical path provided for a grounding pole. The first electrical path includes a first bus bar, a first sub-bus bar, and a first contact device which are electrically connected together. The second electrical path includes a second bus bar, a second sub-bus bar, and a second contact device which are electrically connected together. The power feed control device further includes a third sub-bus bar, a body, a holder, a zero-phase-sequence current transformer, and a control circuit. The third sub-bus bar is electrically connected to the third electrical path. The body has electrical insulation properties. The body holds the first bus bar and the second bus bar. The holder has electrical insulation properties and holds the first sub-bus bar, the second sub-bus bar, and the third sub-bus bar. The zero-phase-sequence current transformer has a through hole. The control circuit controls the first contact device and the second contact device in accordance with an output signal of the zero-phase-sequence current transformer. The first sub-bus bar, the second sub-bus bar, and the third sub-bus bar each include a central piece having an elongated shape, a first leg piece, a second leg piece, an extended piece, and a lead piece. The first leg piece and the second leg piece respectively protrude, along thickness of the central piece, from a first longitudinal end and a second longitudinal end of the central piece. The extended piece protrudes from a tip of the first leg piece along thickness of the first leg piece. The lead piece protrudes from a tip of the extended piece so as to face away from the central piece. The body includes a housing recess to house a module. The module includes the holder, the first sub-bus bar, the second sub-bus bar, the third sub-bus bar, and the zero-phase-sequence current transformer. Lengths of the respective extended pieces of the first sub-bus bar, the second sub-bus bar, and the third sub-bus bar are different from each other. The holder includes a rod portion, a post portion, and an extended portion. The rod portion covers the respective central pieces of the first sub-bus bar, the second sub-bus bar, and the third sub-bus bar and passes through the through hole of the zero-phase-sequence current transformer. The post portion covers the respective first leg pieces of the first sub-bus bar, the second sub-bus bar, and the third sub-bus bar. The extended portion covers the respective extended pieces of the first sub-bus bar, the second sub-bus bar, and the third sub-bus bar.

BRIEF DESCRIPTION OF DRAWINGS

FIG. 5A is a front view of the power feed control unit of the power feed control device;

FIG. 5B is a plan view of the power feed control unit of the power feed control device;

FIG. 5C is a right side view of the power feed control unit of the power feed control device;

FIG. 5D is a bottom view of the power feed control unit of the power feed control device;

FIG. 5E is a rear view of the power feed control unit of the power feed control device;

FIG. 11A is a front view illustrating a state where a DC transformer, a zero-phase-sequence current transformer, and a current transformer are mounted to a sub-bus bar module of the power feed control device;

FIG. 11B is a plan view illustrating the state where the DC transformer, the zero-phase-sequence current transformer, and the current transformer are mounted to the sub-bus bar module of the power feed control device;

FIG. 11C is a left side view illustrating the state where the DC transformer, the zero-phase-sequence current transformer, and the current transformer are mounted to the sub-bus bar module of the power feed control device;

FIG. 11D is a right side view illustrating the state where the DC transformer, the zero-phase-sequence current transformer, and the current transformer are mounted to the sub-bus bar module of the power feed control device;

FIG. 11E is a bottom view illustrating the state where the DC transformer, the zero-phase-sequence current transformer, and the current transformer are mounted to the sub-bus bar module of the power feed control device;

FIG. 11F is a rear view illustrating the state where the DC transformer, the zero-phase-sequence current transformer, and the current transformer are mounted to the sub-bus bar module of the power feed control device;

FIG. 16A illustrates how to mount the DC transformer and the zero-phase-sequence current transformer onto the sub-bus bar module of the power feed control device; and FIG. 16B illustrates how to mount the current transformer onto the sub-bus bar module of the power feed control device.

DESCRIPTION OF EMBODIMENTS

Figure 1:
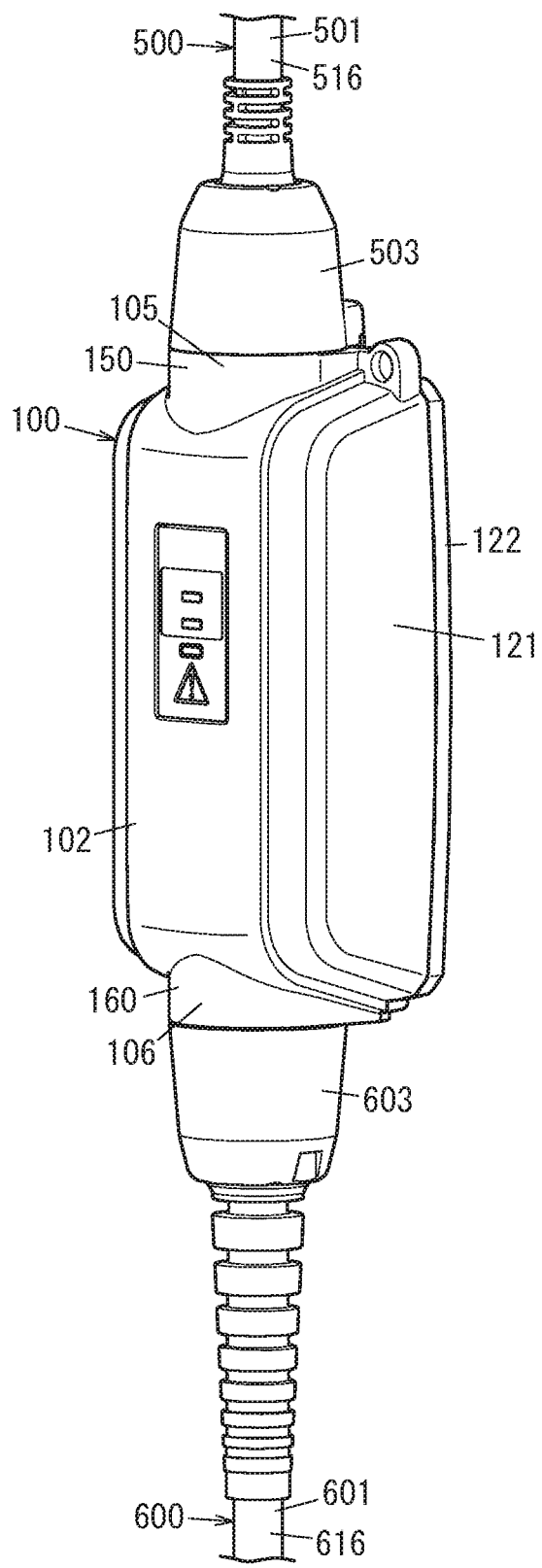
FIG. 1 is a perspective view illustrating a state where a power-side cable and a connector cable are connected to a power feed control device according to an embodiment of the present invention.

Note that the embodiment to be described below is only an exemplary one of various embodiments of the present invention and should not be construed as limiting. Rather, the embodiment may be readily modified in various manners, depending on a design choice or any other factor, without departing from a true spirit and scope of the present invention.

(Embodiment)

A power feed control device 100 according to an exemplary embodiment will be described with reference to FIGS. 1-16B.

The power feed control device 100 may be implemented as a charge circuit interrupt device (CCID) for controlling feeding electricity from an AC power supply to a load circuit 700 (see FIG. 2) of an electric motor vehicle. Examples of the electric motor vehicles include an electric vehicle and a hybrid vehicle. The load circuit 700 includes a rechargeable battery 701 for the electric motor vehicle and a charging circuit 702 for charging the rechargeable battery 701. The power feed control device 100 includes a zero-phase-sequence current transformer 8, and is configured to stop supplying electricity from the AC power supply to the load circuit 700 on detecting any leakage of electricity based on the output of the zero-phase-sequence current transformer 8.

The power feed control device 100 is used so as to be interposed between a power plug cable 500 to be connected to the AC power supply and a connector cable 600 to be connected to the electric motor vehicle. The power feed control device 100 includes a power-side connector 105 to be connected to the power plug cable 500 and a load-side connector 106 to be connected to the connector cable 600. Note that the power plug cable 500 and the connector cable 600 are not essential constituent elements for the power feed control device 100.

The power plug cable 500 is used to electrically connect the power feed control device 100 to the AC power supply. For that purpose, the power plug cable 500 includes a cable 501, a power plug 502, and a receptacle 503. The power plug 502 is provided at one end of the cable 501. The power plug 502 is readily insertable and removable into/from an AC outlet. The receptacle 503 is provided at the other end of the cable 501. The receptacle 503 is attachable and removable to/from the power-side connector 105 of the power feed control device 100.

The power plug 502 includes a first blade contact 521, a second blade contact 522, a grounding blade 523, and a series circuit of a first thermistor 524 and a second thermistor 525. The first blade contact 521, the second blade contact 522, and the grounding blade 523 have electrical conductivity. The first thermistor 524 detects the temperature of the first blade contact 521. The second thermistor 525 detects the temperature of the second blade contact 522. Each of the first thermistor 524 and the second thermistor 525 may be implemented as a positive temperature coefficient (PTC) thermistor, for example.

The cable 501 includes a first power-side electric wire 511, a second power-side electric wire 512, a third power-side electric wire 513, a fourth power-side electric wire 514, a fifth power-side electric wire 515, and a power-side sheath 516. The first power-side electric wire 511 is connected to the first blade contact 521. The second power-side electric wire 512 is connected to the second blade contact 522. The third power-side electric wire 513 is connected to the grounding blade 523. The fourth power-side electric wire 514 is connected to one terminal of the series circuit of the first thermistor 524 and the second thermistor 525. The fifth power-side electric wire 515 is connected to the other terminal of the series circuit of the first thermistor 524 and the second thermistor 525. In this cable 501, the power-side sheath 516 covers all of the first power-side electric wire 511, the second power-side electric wire 512, the third power-side electric wire 513, the fourth power-side electric wire 514, and the fifth power-side electric wire 515.

The connector cable 600 is used to electrically connect the power feed control device 100 to the load circuit 700 of the electric motor vehicle. For that purpose, the connector cable 600 includes a cable 601, a charging connector 602 (charging plug), and a load-side receptacle 603. The charging connector 602 is provided at one terminal of the cable 601. The charging connector 602 is attachable and removable to/from a charging inlet (charging port) 702 of the electric motor vehicle. The load-side receptacle 603 is provided at the other terminal of the cable 601. The load-side receptacle 603 is attachable and removable to/from the load-side connector 106 of the power feed control device 100.

The cable 601 includes a first load-side electric wire 611, a second load-side electric wire 612, a third load-side electric wire 613, a fourth load-side electric wire 614, and a load-side sheath 616. In this cable 601, the load-side sheath 616 covers all of the first load-side electric wire 611, the second load-side electric wire 612, the third load-side electric wire 613, and the fourth load-side electric wire 614.

Next, the circuit configuration of the power feed control device 100 will be described with reference to FIG. 2, and then the structure of the power feed control device 100 will be described.

The power feed control device 100 includes a first electrical path 1, a second electrical path 2, a third electrical path 3, a DC transformer 7, a zero-phase-sequence current transformer 8, a current transformer 9, a control circuit 10, a power supply circuit 14, an electric leakage detector circuit 15, and a current monitor circuit 16. In the power feed control device 100 of this embodiment, the first electrical path 1 and the second electrical path 2 form a pair of power feed paths.

The first electrical path 1 is an electrical path provided for the hot pole (L phase) to electrically connect the first power-side electric wire 511 to the first load-side electric wire 611. In this embodiment, the power feed control device 100 includes a first relay Ry1 including a first contact device S forming part of the first electrical path 1 and a first relay coil Ly1. The first relay Ry1 is implemented as an electromagnetic relay. The first contact device S1 is a normally open contact device.

The second electrical path 2 is an electrical path provided for the neutral pole (N phase) to electrically connect the second power-side electric wire 512 to the second load-side electric wire 612. In this embodiment, the power feed control device 100 includes a second relay Ry2 including a second contact device S2 forming part of the second electrical path 2 and a second relay coil Ly2. The second relay Ry2 is implemented as an electromagnetic relay. The second contact device S2 is a normally open contact device.

The third electrical path 3 is an electrical path provided for the grounding pole (PE) to electrically connect the third power-side electric wire 513 to the third load-side electric wire 613.

The power feed control device 100 is connected to the load circuit 700 via the charging inlet 720 of the electric motor vehicle as described above. The load circuit 700 includes not only the rechargeable battery 701 and the charging circuit 702 but also a relay 703, a detector (not shown), and a charging controller 705. The charging connector 602 of the connector cable 600 is connected to the charging inlet 720. The relay 703 includes a contact device provided halfway through a charging path leading from the charging circuit 702 to the rechargeable battery 701. The detector (detector circuit) detects the AC power supplied to the charging circuit 702. The charging controller (charging control circuit) 705 controls the ON/OFF states of the relay 703 in accordance with the result of detection by the detector.

When the detector detects AC power, the charging controller 705 turns the relay 703 ON. This allows the charging circuit 702 to start charging the rechargeable battery 701. On the other hand, when the detector detects no AC power any longer, the charging controller 705 turns the relay 703 OFF. This allows the charging circuit 702 to stop charging the rechargeable battery 701.

The fourth load-side electric wire 614 is an electric wire for transmitting a control pilot signal from the load circuit 700 to the power feed control device 100. This allows the load circuit 700 to transmit the control pilot signal to the power feed control device 100 through the fourth load-side electric wire 614.

In response to the control pilot signal, the control circuit 10 determines whether or not the charging connector 602 of the connector cable 600 is connected to the charging inlet 720 of the electric motor vehicle and whether or not charging the rechargeable battery 701 is permitted, and also detects the charging state of the rechargeable battery 701. In this case, the control circuit 10 controls the first relay Ry1 and the second relay Ry2 based on the result of detection responsive to the control pilot signal.

The control circuit 10 is electrically connected to the power supply circuit 14, the electric leakage detector circuit 15, the current monitor circuit 16, the first relay coil Ly1, and the second relay coil Ly2.

The power supply circuit 14 is electrically connected to the first electrical path 1, the second electrical path 2, and the third electrical path 3. The power supply circuit 14 converts the AC voltage supplied from the AC power supply to between the first electrical path 1 and the second electrical path 2 into a DC voltage, thereby generating a DC voltage to operate the control circuit 10. The power supply circuit 14 may be implemented as an AC-DC converter, for example. The power supply circuit 14 supplies an operating DC voltage to the control circuit 10, the electric leakage detector circuit 15, and the current monitor circuit 16.

Figure 12A:
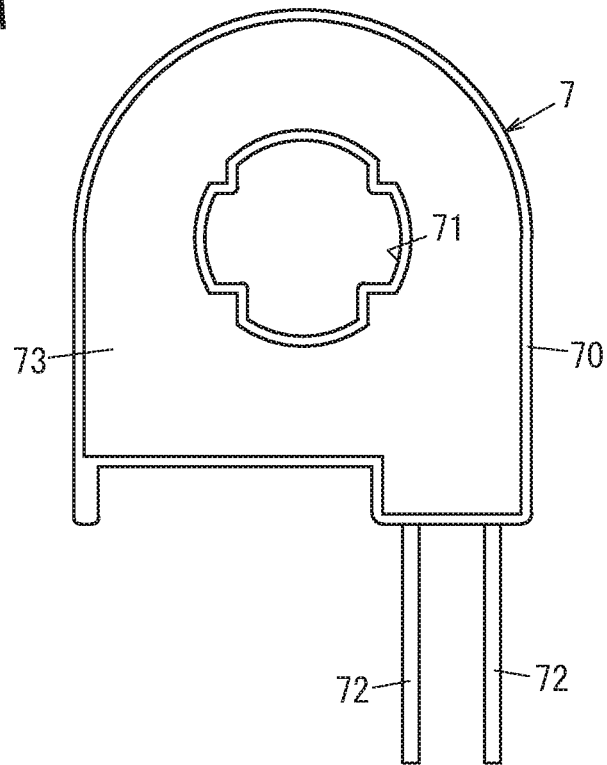
FIG. 12A is a front view of the DC transformer of the power feed control device.
Figure 12B:
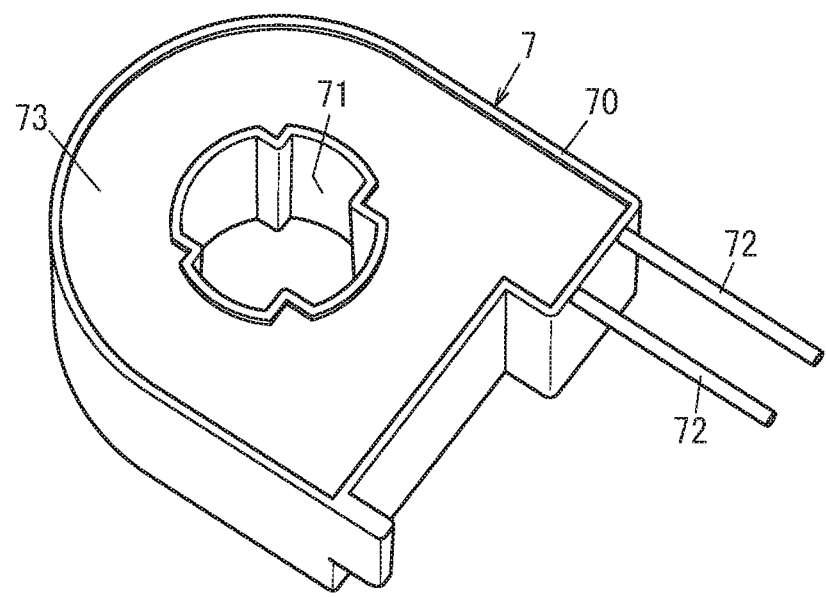
FIG. 12B is a perspective view of the DC transformer of the power feed control device.

In this power feed control device 100, a first sub-bus bar 12 of the first electrical path 1 (see FIGS. 7B and 9), a second sub-bus bar 22 of the second electrical path 2 (see FIG. 9), and the third sub-bus bar 32 (see FIG. 9) connected to the third electrical path 3 pass through a through hole 71 of the DC transformer 7 (see FIGS. 12A and 12B). In addition, in this power feed control device 100, the first sub-bus bar 12, the second sub-bus bar 22, and the third sub-bus bar 32 pass through a through hole 81 of the zero-phase-sequence current transformer 8 (see FIGS. 13A and 13B). Furthermore, in this power feed control device 100, the first sub-bus bar 12 passes through a through hole 91 of the current transformer 9 (see FIGS. 14A and 14B).

The electric leakage detector circuit 15 may include, for example, an AC leakage current detection section (AC leakage current detector circuit) for detecting an AC leakage current based on an output signal of the zero-phase-sequence current transformer 8 and a DC leakage current detection section (DC leakage current detector circuit) for detecting a DC leakage current based on an output signal of the DC transformer 7. The electric leakage detector circuit 15 outputs an electric leakage detection signal when the AC leakage current detection section detects any AC leakage current or when the DC leakage current detection section detects any DC leakage current. The current monitor circuit 16 monitors, based on the output signal of the current transformer 9, the first electrical path 1 to see if any overcurrent is flowing through the first electrical path 1. On finding an overcurrent flowing through the first electrical path 1, the current monitor circuit 16 outputs an overcurrent detection signal.

The control circuit 10 controls the first relay Ry1 and the second relay Ry2 based on the output signal(s) of at least one of the zero-phase-sequence current transformer 8, the DC transformer 7, or the current transformer 9. More specifically, on receiving the electric leakage detection signal from the electric leakage detector circuit 15, the control circuit 10 turns OFF the first contact device S1 of the first relay Ry1 and the second contact device S2 of the second relay Ry2. On the other hand, on receiving the overcurrent detection signal from the current monitor circuit 16, the control circuit 10 turns OFF the first contact device S1 of the first relay Ry1 and the second contact device S2 of the second relay Ry2.

In addition, the control circuit 10 further controls the first relay Ry1 and the second relay Ry2 based on an output signal of the series circuit of the first thermistor 524 and the second thermistor 525. More specifically, when the output signal of the series circuit of the first thermistor 524 and the second thermistor 525 exceeds a threshold value, the control circuit 10 turns OFF the first contact device S1 of the first relay Ry1 and the second contact device S2 of the second relay Ry2.

The first relay Ry1 includes the first contact device S1 having a first fixed contact and a first movable contact and a first electromagnet device having the first relay coil Ly1. The first relay Ry1 further includes a pair of first output terminals connected to the first fixed contact and the first movable contact, respectively, and a pair of first control terminals respectively connected to both terminals of the first relay coil Ly1. In the first relay Ry1, when the first fixed contact and the first movable contact are in contact with each other, the first relay Ry1 is in ON state, and the pair of first output terminals are electrically connected together. On the other hand, when the first fixed contact and the first movable contact are out of contact with each other, the first relay Ry1 is in OFF state, and the pair of first output terminals are electrically insulated from each other. The pair of first control terminals is electrically connected to the control circuit 10.

The second relay Ry2 includes the second contact device S2 having a second fixed contact and a second movable contact and a second electromagnet device having the second relay coil Ly2. The second relay Ry2 further includes a pair of second output terminals connected to the second fixed contact and the second movable contact, respectively, and a pair of second control terminals respectively connected to both terminals of the second relay coil Ly2. In the second relay Ry2, when the second fixed contact and the second movable contact are in contact with each other, the second relay Ry2 is in ON state, and the pair of second output terminals are electrically connected together. On the other hand, when the second fixed contact and the second movable contact are out of contact with each other, the second relay Ry2 is in OFF state, and the pair of second output terminals are electrically insulated from each other. The pair of second control terminals is electrically connected to the control circuit 10.

Figure 3:
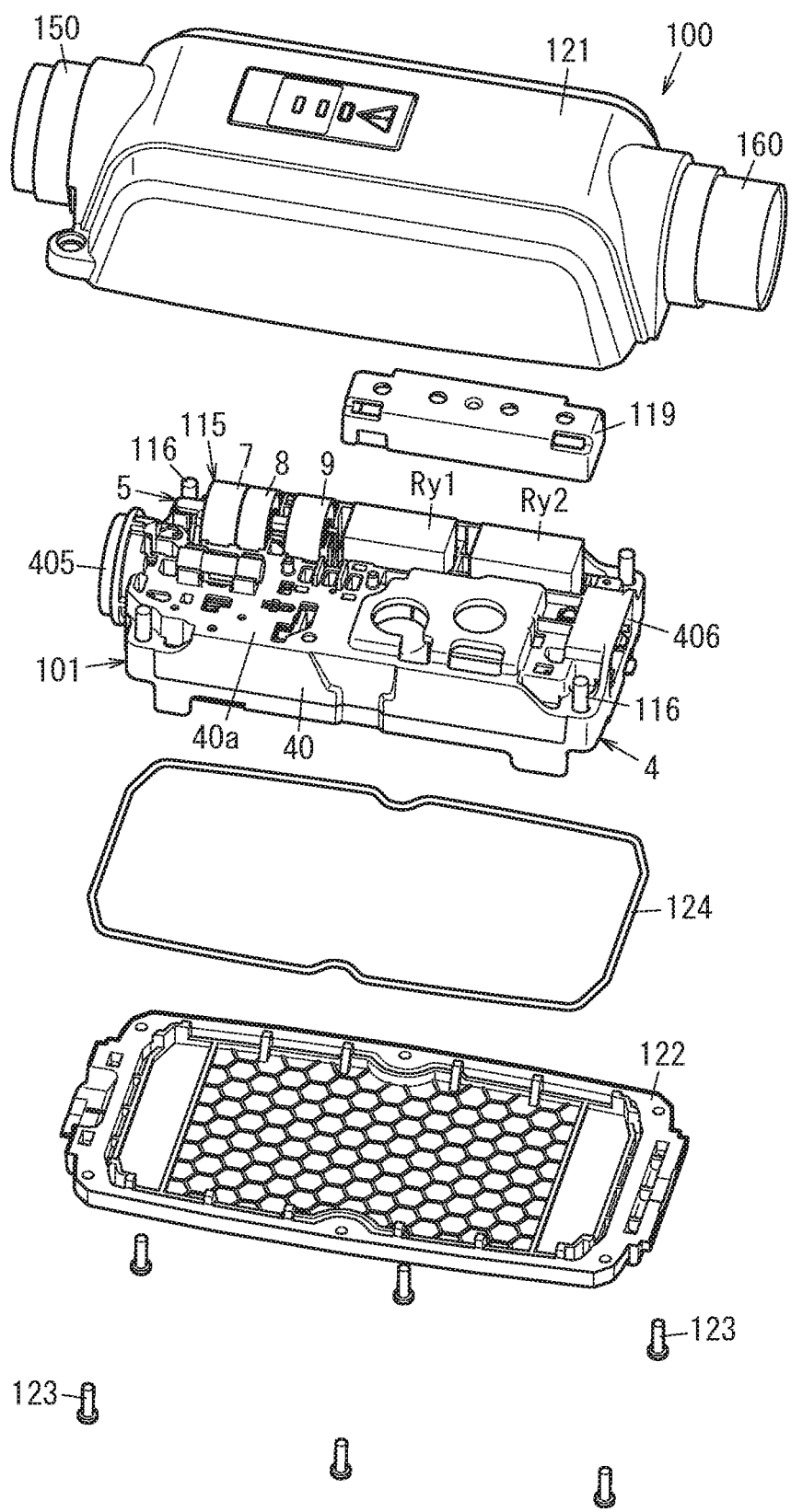
FIG. 3 is an exploded perspective view of the power feed control device.
Figure 4:
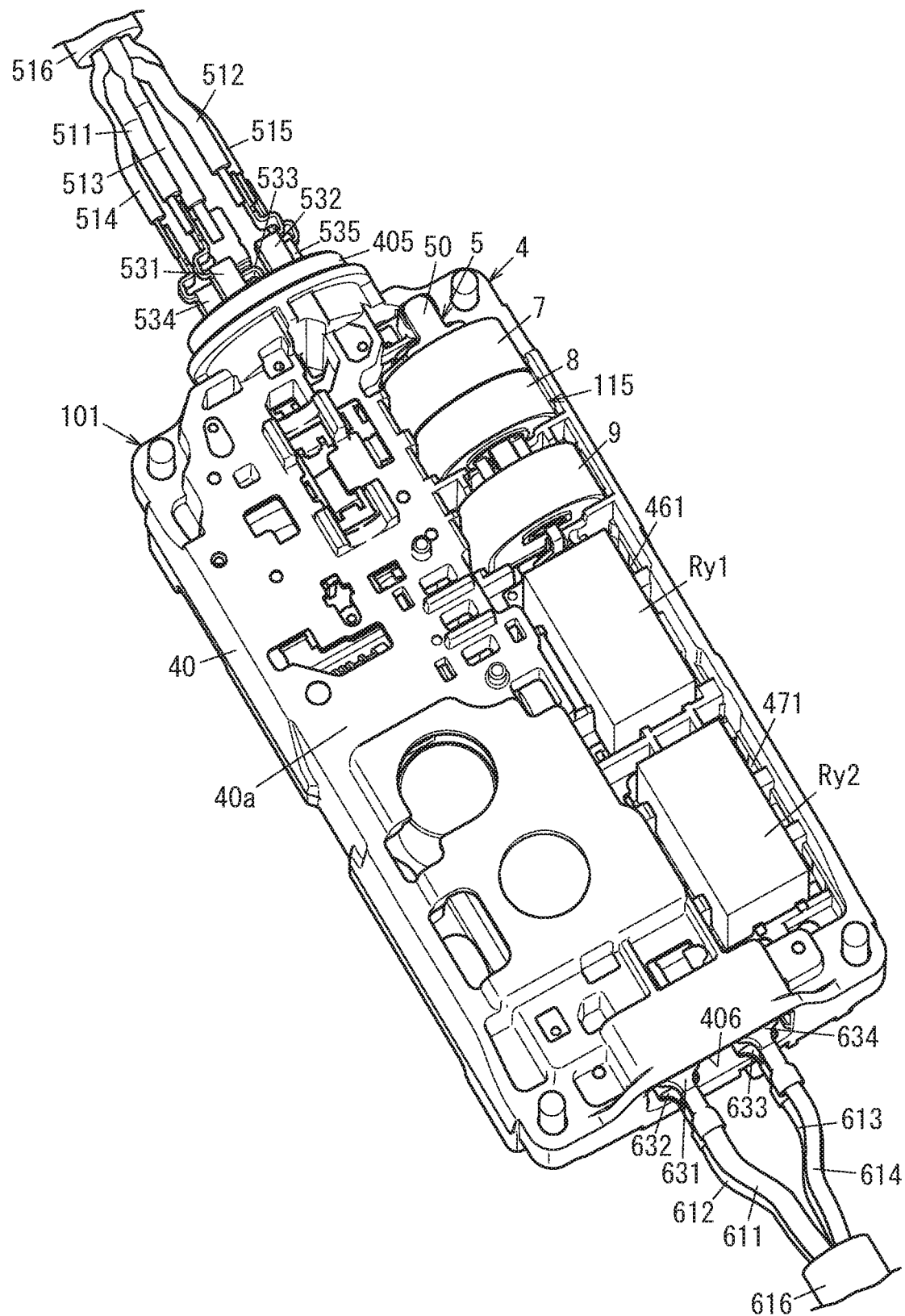
FIG. 4 is a perspective view illustrating a state where the power-side cable and the connector cable are connected to a power feed control unit of the power feed control device.

The power feed control device 100 includes a power feed control unit 101 and a hollow housing 102 for housing the power feed control unit 101 as shown in FIGS. 1 and 3.

The housing 102 includes a box-shaped case 121, of which one side has an opening, and a rectangular plate cover 122 joined with the case 121 to close the opening of the case 121. The case 121 and the cover 122 are joined together with a plurality of (e.g., six in this example) screws 123. The case 121 and the cover 122 may be made of polybutylene terephthalate (PBT), for example. In this embodiment, a rectangular ring packing 124 is interposed between a peripheral edge of the opening of the case 121 and the cover 122.

In this power feed control device 100, the power-side connector 105 is provided at one longitudinal end of the housing 102 and the load-side connector 106 is provided at the other longitudinal end of the housing 102. The power-side connector 105 includes a cylindrical portion 150 protruding outward from the case 121 along the length of the case 121. The load-side connector 106 includes another cylindrical portion 160 protruding outward from the case 121 along the length of the case 121.

Figure 9:
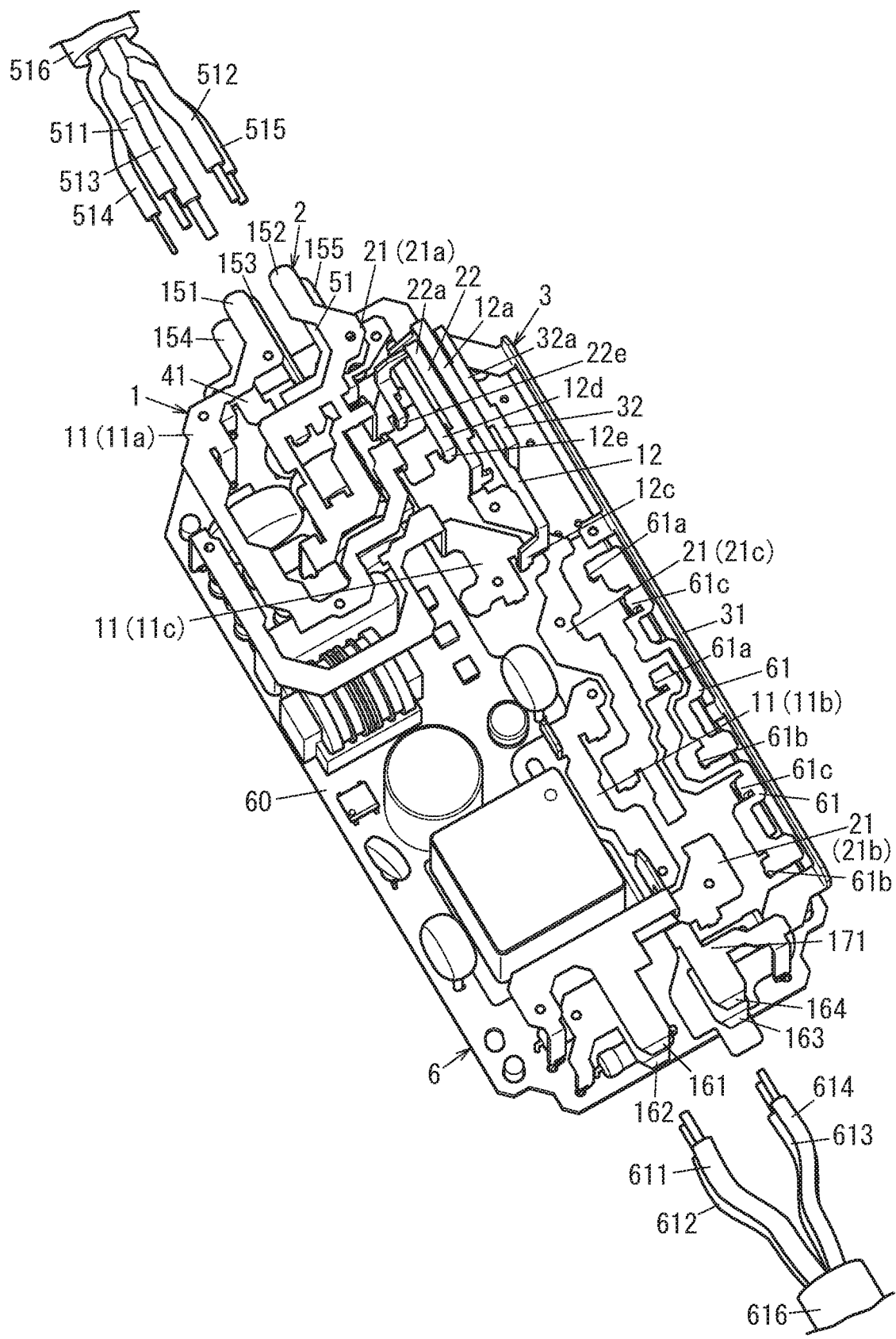
FIG. 9 is a perspective view illustrating respective main parts of the power feed control unit, the power-side cable, and the connector cable in the power feed control device.
Figure 10:
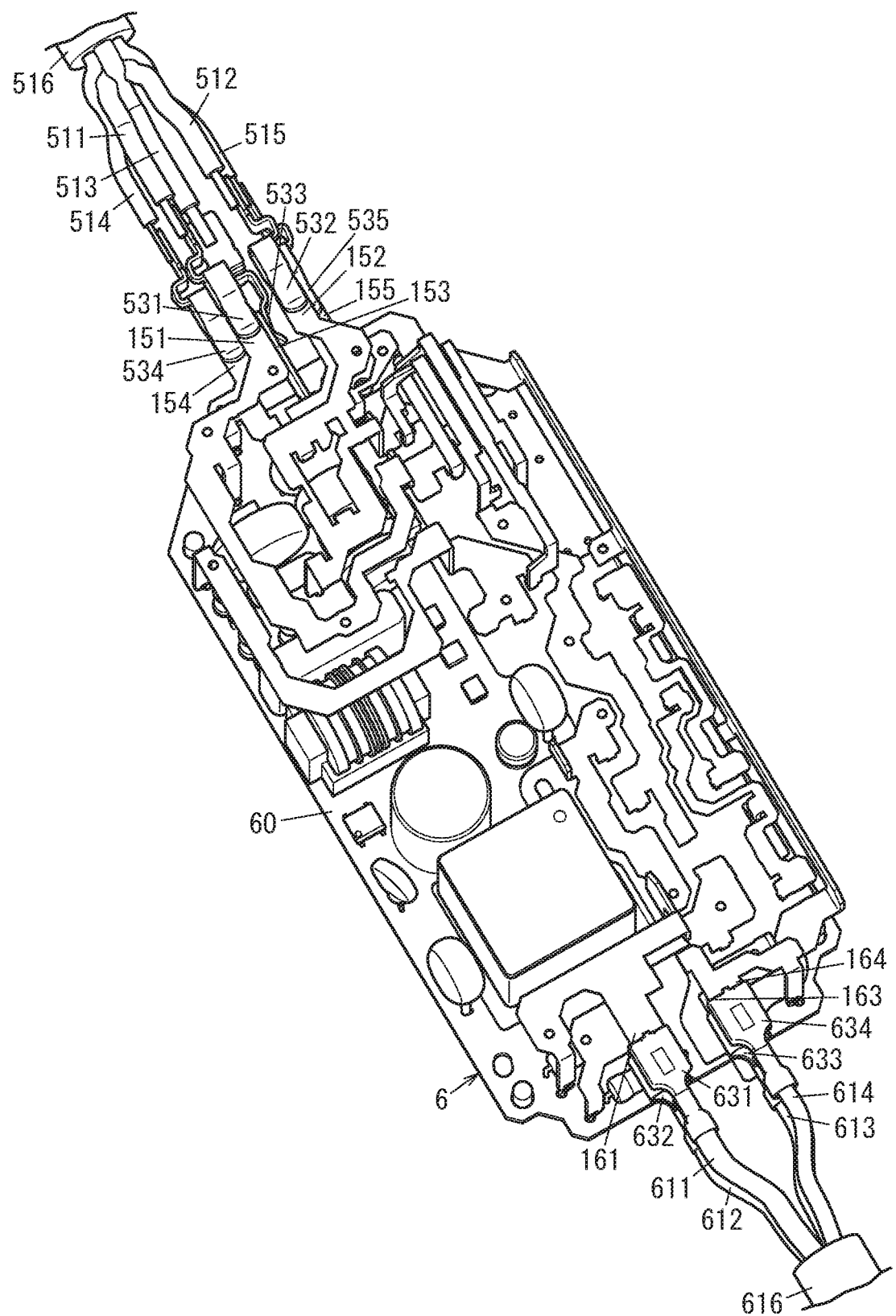
FIG. 10 is a perspective view illustrating the main parts in a state where the power-side cable and the connector cable are connected to the power feed control unit of the power feed control device.

The power-side connector 105 includes a first power-side contact 151, a second power-side contact 152, a third power-side contact 153, a fourth power-side contact 154, and a fifth power-side contact 151, as shown in FIGS. 5B, 9, and 10. As shown in FIG. 10, a terminal 531 fixed to the first power-side electric wire 511 is connected detachably to the first power-side contact 151. A terminal 532 fixed to the second power-side electric wire 512 is connected detachably to the second power-side contact 152. A terminal 533 fixed to the third power-side electric wire 513 is connected detachably to the third power-side contact 153. A terminal 534 fixed to the fourth power-side electric wire 514 is connected detachably to the fourth power-side contact 154. A terminal 535 fixed to the fifth power-side electric wire 515 is connected detachably to the fifth power-side contact 155.

The load-side connector 106 includes a first load-side contact 161, a second load-side contact 162, a third load-side contact 163, and a fourth load-side contact 164, as shown in FIGS. 5D, 9, and 10. As shown in FIG. 10, a terminal 631 fixed to the first load-side electric wire 611 is connected detachably to the first load-side contact 161. A terminal 632 fixed to the second load-side electric wire 612 is connected detachably to the second load-side contact 162. A terminal 633 fixed to the third load-side electric wire 613 is connected detachably to the third load-side contact 163. A terminal 634 fixed to the fourth load-side electric wire 614 is connected detachably to the fourth load-side contact 164.

Figure 2:
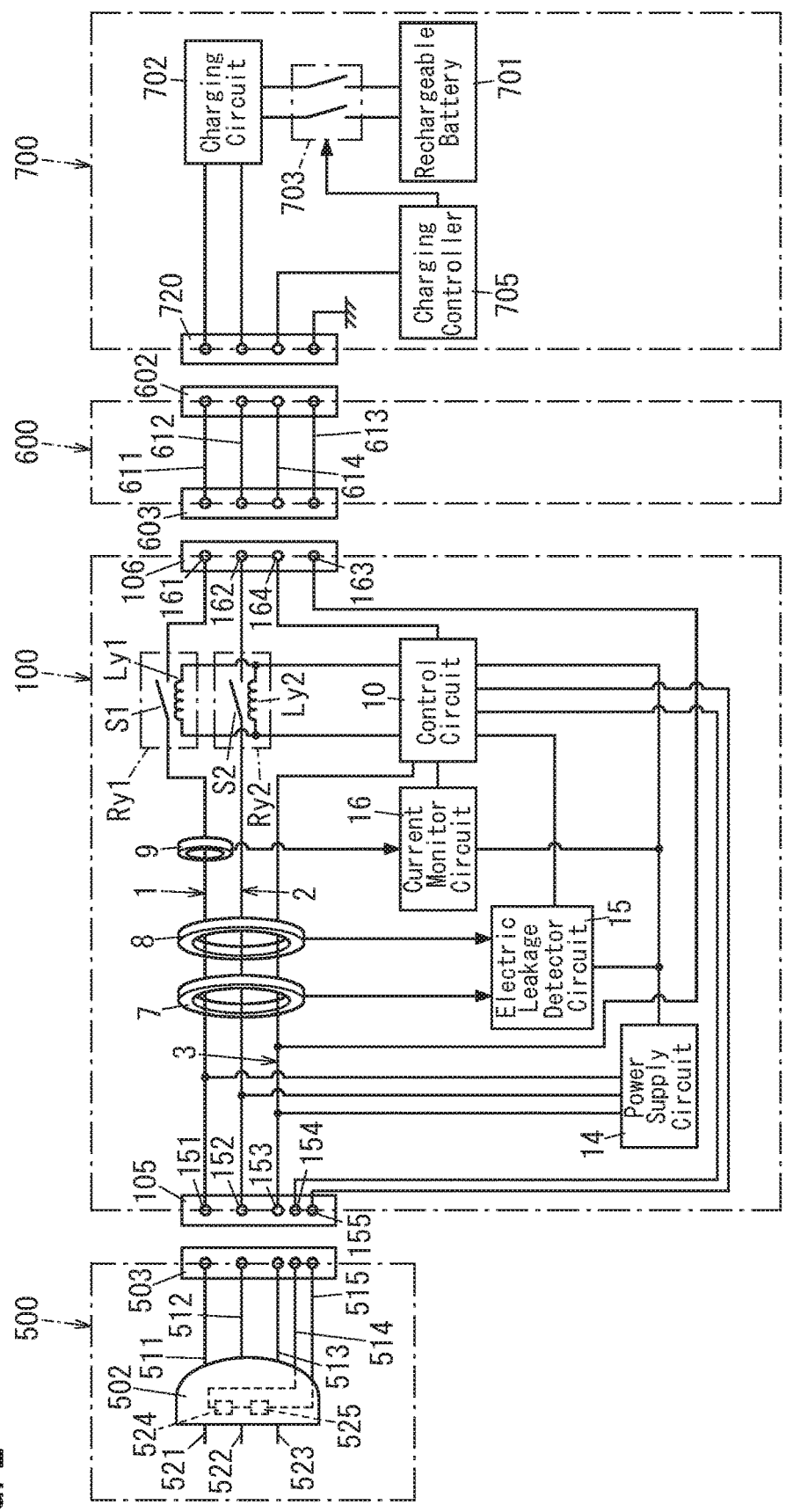
FIG. 2 is a circuit diagram of a circuit including the power feed control device, a power plug cable, the connector cable, and a load circuit.

As shown in FIG. 9, the first electrical path 1 includes a plurality of (e.g., three in this example) first bus bars 11, a first sub-bus bar 12, and the first contact device S1 of the first relay Ry1 (see FIG. 2). The plurality of first bus bars 11 includes a first power-side bus bar 11a, a first load-side bus bar 11b, and a first intermediate bus bar 11c. The first power-side bus bar 11a includes the first power-side contact 151. The first load-side bus bar 11b includes the first load-side contact 161. The first intermediate bus bar 11c forms part of the first electrical path 1 between the first power-side bus bar 11a and the first load-side bus bar 11b.

As shown in FIG. 9, the second electrical path 2 includes a plurality of (e.g., three in this example) second bus bars 21, a second sub-bus bar 22, and the second contact device S2 of the second relay Ry2 (see FIG. 2). The plurality of second bus bars 21 includes a second power-side bus bar 21a, a second load-side bus bar 21b, and a second intermediate bus bar 21c. The second power-side bus bar 21a includes the second power-side contact 152. The second load-side bus bar 21b includes the second load-side contact 162. The second intermediate bus bar 21c forms part of the second electrical path 2 between the second power-side bus bar 21a and the second load-side bus bar 21b.

The third electrical path 3 includes a third bus bar 31 as shown in FIG. 9. The third bus bar 31 includes the third power-side contact 153 and the third load-side contact 163.

Each of the plurality of first bus bars 11, the first sub-bus bar 12, the plurality of second bus bars 21, the second sub-bus bar 22, the third bus bar 31, and the third sub-bus bar 32 may be formed by subjecting a conductor plate to bending. The conductor plate may be made of a copper alloy, for example.

The power feed control unit 101 includes a bus bar module 4, a sub-bus bar module 5, and a circuit module 6, as shown in FIGS. 5A-7B.

The bus bar module 4 includes the plurality of first bus bars 11, the plurality of second bus bars 21, the third bus bar 31, and a rectangular parallelepiped body 40. The plurality of first bus bars 11, the plurality of second bus bars 21, and the third bus bar 31 are held by the body 40. The body 40 has electrical insulation properties. The body 40 is a resin molded product and may be made of PBT, for example. In this example, the plurality of first bus bars 11, the plurality of second bus bars 21, and the third bus bar 31 have been insert-molded with respect to the body 40. The body 40 has a first surface 40a and a second surface 40b forming two opposite surfaces of the body 40 along the thickness thereof (i.e., in the upward/downward direction in FIG. 5D).

The bus bar module 4 further includes a fourth bus bar 41 (see FIG. 9) and a fifth bus bar 51 (see FIG. 9). The fourth bus bar 41 includes the fourth power-side contact 154. The fifth bus bar 51 includes the fifth power-side contact 155.

The bus bar module 4 further includes a pair of sixth bus bars 61 (see FIG. 9). The pair of sixth bus bars 61 is provided to connect each of the pair of first control terminals of the first relay Ry1 and the pair of second control terminals of the second relay Ry2 to the control circuit 10. In other words, the pair of sixth bus bars 61 are connected one by one to both terminals of the first relay coil Ly1 of the first relay Ry1 and are also connected one by one to both terminals of the second relay coil Ly2 of the second relay Ry2. The bus bar module 4 further includes a seventh bus bar 171. The seventh bus bar 171 includes the fourth load-side contact 164.

Each of the fourth bus bar 41, the fifth bus bar 51, the pair of sixth bus bars 61, and the seventh bus bar 171 may be formed by subjecting a conductor plate to bending. The conductor plate may be made of a copper alloy, for example. The fourth bus bar 41, the fifth bus bar 51, the pair of sixth bus bars 61, and the seventh bus bar 171 have been insert-molded with respect to the body 40.

The body 40 includes, as an integral part thereof, a circular frame 405 (see FIGS. 3-6) forming part of the power-side connector 105. As shown in FIG. 5B, the circular frame 405 partially surrounds the first power-side contact 151, the second power-side contact 152, the third power-side contact 153, the fourth power-side contact 154, and the fifth power-side contact 155.

The body 40 further has a recess 406 (see FIGS. 3-6) forming part of the load-side connector 106. In the power feed control unit 101, the first load-side contact 161, the second load-side contact 162, the third load-side contact 163, and the fourth load-side contact 164 are partially arranged in the recess 406 as shown in FIG. 5D.

The first surface 40a of the body 40 has a first recess 461 that houses the first relay Ry1 partially and a second recess 471 that houses the second relay Ry2 partially as shown in FIGS. 4A and 5A.

The pair of first control terminals of the first relay Ry1 are connected by tungsten inert gas (TIG) welding, for example, to respective connection pieces 61a of the pair of sixth bus bars 61 (see FIG. 9) through a pair of holes of the bottom wall of the first recess 461. The pair of first output terminals of the first relay Ry1 are connected by TIG welding, for example, to the pair of their associated first bus bars 11 (namely, the first intermediate bus bar 11c and the first load-side bus bar 11b, respectively). This allows the first relay Ry1 to be fixed onto the bus bar module 4.

The pair of second control terminals of the second relay Ry2 are connected by TIG welding, for example, to respective connection pieces 61b of the pair of sixth bus bars 61 through a pair of holes of the bottom wall of the second recess 471. The pair of second output terminals of the second relay Ry2 are connected by TIG welding, for example, to the pair of their associated second bus bars 21 (namely, the second intermediate bus bar 21c and the second load-side bus bar 21b, respectively). This allows the second relay Ry2 to be fixed onto the bus bar module 4.

The pair of sixth bus bars 61 each includes a lead piece 61c to be connected to the circuit module 6. In this example, the circuit module 6 includes a printed wiring board 60, the control circuit 10, the power supply circuit 14, the electric leakage detector circuit 15, and the current monitor circuit 16 (see FIGS. 2 and 9). The respective lead pieces 61c of the pair of sixth bus bars 61 are soldered to the printed wiring board 60. This allows the first relay coil Ly1 of the first relay Ry1 and the second relay coil Ly2 of the second relay Ry2 to be connected to the control circuit 10 (see FIG. 2) of the circuit module 6. The power feed control unit 101 includes a cover 119 (see FIGS. 3 and 6) that wraps the first relay Ry1 and the second relay Ry2.

The printed wiring board 60 (see FIGS. 5B-7B and 9) has a rectangular plate shape. The control circuit 10 and the power supply circuit 14 are electrically connected to the third electrical path 3.

The circuit module 6 is mounted onto the body 40 of the bus bar module 4 with four screws 65 (see FIG. 5E), each of which is passed through a hole at an associated one of the four corners of the printed wiring board 60.

The power feed control unit 101 is mounted with four screws 116 (see FIG. 5E) onto the case 121 (see FIGS. 1 and 3) of the housing 102.

The second surface 40b of the body 40 is provided with circular columnar positioning protrusions 40c (see FIG. 5C) to be fitted into positioning holes 63 (see FIG. 5E) of the printed wiring board 60.

The power feed control device 100 further includes an insulating sheet 114 (see FIGS. 6, 7A, and 7B) arranged between the printed wiring board 60 and the bus bar module 4. The insulating sheet 114 has electrical insulation properties. The insulating sheet 114 may be made of a synthetic resin (such as polycarbonate).

The sub-bus bar module 5 includes the first sub-bus bar 12, the second sub-bus bar 22, the third sub-bus bar 32, and a holder 50 as shown in FIGS. 7A, 7B, 11A, 11B, 11D-11F, 15A, 15B, and 15C. The first sub-bus bar 12, the second sub-bus bar 22, and the third sub-bus bar 32 are each formed by subjecting a conductor plate to bending. The first sub-bus bar 12, the second sub-bus bar 22, and the third sub-bus bar 32 are held by the holder 50. In this example, the first sub-bus bar 12, the second sub-bus bar 22, and the third sub-bus bar 32 have been insert-molded with respect to the holder 50. The holder 50 has electrical insulation properties and may be made of PBT, for example.

The first sub-bus bar 12, the second sub-bus bar 22, and the third sub-bus bar 32 each include a central piece 12a, 22a, 32a, a first leg piece 12b, 22b, 32b, a second leg piece 12c, 22c, 32c, an extended piece 12d, 22d, 32d, and a lead piece 12e, 22e, 32e. The central pieces 12a, 22a, and 32a are arranged parallel to the printed wiring board 60 so as to be spaced from the printed wiring board 60 along the thickness of the body 40. Each of the first leg pieces 12b, 22b, and 32b protrudes from a first longitudinal end of its associated central piece 12a, 22a, 32a toward the printed wiring board 60. Each of the second leg pieces 12c, 22c, and 32c protrudes from a second longitudinal end of its associated central piece 12a, 22a, 32a toward the printed wiring board 60. Each of the extended pieces 12d, 22d, and 32d protrudes from the tip of its associated first leg piece 12b, 22b, 32b along the thickness the first leg piece 12b, 22b, 32b. Each of the lead pieces 12e, 22e, and 32e protrudes from the tip of its associated extended piece 12d, 22d, 32d toward the printed wiring board 60 to be electrically connected to the first bus bar 11, the second bus bar 21, or the third bus bar 31. The lead piece 12e of the first sub-bus bar 12 is connected by TIG welding, for example, to the connection piece 111 (see FIG. 8) of the first bus bar 11 (more specifically, the first power-side bus bar 11a) through the hole 460 of the body 40. The second leg piece 12c of the first sub-bus bar 12 is connected by TIG welding, for example, to the connection piece 110 (see FIG. 8) of the first intermediate bus bar 11c (see FIG. 9) connected to the printed wiring board 60 through the hole 470 of the body 40. This allows the first power-side bus bar 11a and the first intermediate bus bar 11c to be electrically connected together via the first sub-bus bar 12. The lead piece 22e of the second sub-bus bar 22 is connected by TIG welding, for example, to the connection piece 211 (see FIG. 8) of the second bus bar 21 (more specifically, the second power-side bus bar 21a) through the hole 462 of the body 40. The second leg piece 22c of the second sub-bus bar 22 is connected by TIG welding, for example, to the connection piece 210 (see FIG. 8) of the second bus bar 21 (second intermediate bus bar 21c) through the hole 472 of the body 40. The lead piece 32e of the third sub-bus bar 32 is connected by TIG welding, for example, to the connection piece 311 (see FIG. 8) of the third bus bar 31 through the hole 463 of the body 40. The second leg piece 32c of the third sub-bus bar 32 is soldered to the printed wiring board 60 and electrically connected to the control circuit 10.

As described above, the control circuit 10 controls the first relay Ry1 and the second relay Ry2 in accordance with the output signal of at least one of the DC transformer 7, the zero-phase-sequence current transformer 8, or the current transformer 9. The DC transformer 7 includes a through hole 71 and a pair of lead terminals 72 as shown in FIGS. 12A and 12B. More specifically, the DC transformer 7 includes a case 70 with electrical insulation properties, a core arranged in the case 70, a coil arranged in the case 70 and wound around the core, and a molding portion 73 covering the coil and other members in the case 70. In addition, in the DC transformer 7, the pair of lead terminals 72 are respectively connected one by one to both terminals of the coil. In the DC transformer 7, the respective central pieces 12a, 22a, and 32a of the first sub-bus bar 12, the second sub-bus bar 22, and the third sub-bus bar 32 pass through the through hole 71. The pair of lead terminals 72 is soldered to the printed wiring board 60. The through hole 71 is cut through the case 70.

Figure 13A:
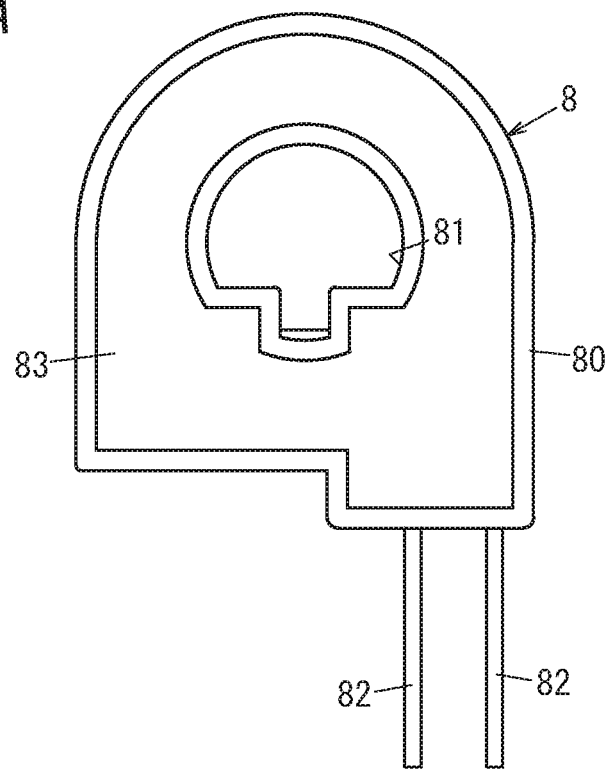
FIG. 13A is a front view of the zero-phase-sequence current transformer of the power feed control device.
Figure 13B:
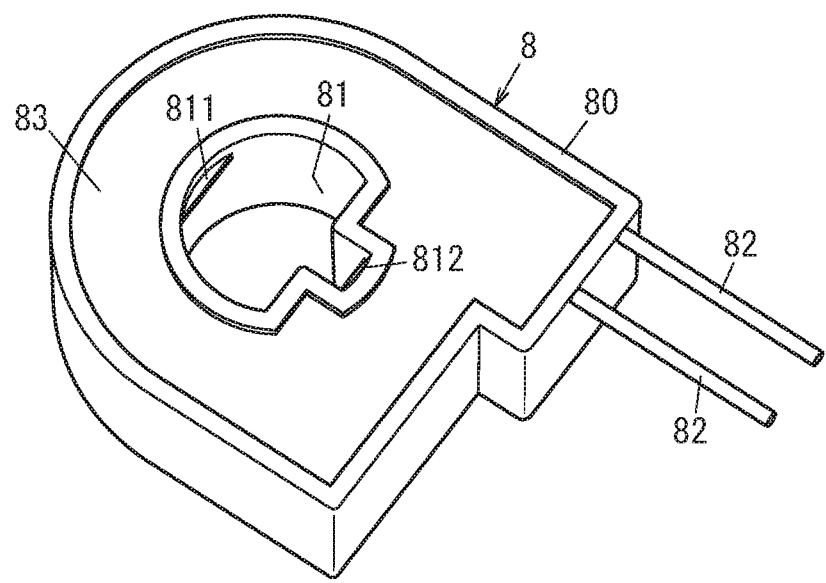
FIG. 13B is a perspective view of the zero-phase-sequence current transformer of the power feed control device.

The zero-phase-sequence current transformer 8 includes a through hole 81 and a pair of lead terminals 82 as shown in FIGS. 13A and 13B. More specifically, the zero-phase-sequence current transformer 8 includes a case 80 with electrical insulation properties, a core arranged in the case 80, a coil arranged in the case 80 and wound around the core, and a molding portion 83 covering the coil and other members in the case 80. In addition, in the zero-phase-sequence current transformer 8, the pair of lead terminals 82 are respectively connected one by one to both terminals of the coil. In the zero-phase-sequence current transformer 8, the respective central pieces 12a, 22a, and 32a of the first sub-bus bar 12, the second sub-bus bar 22, and the third sub-bus bar 32 pass through the through hole 81. The pair of lead terminals 82 is soldered to the printed wiring board 60. The through hole 81 is cut through the case 80.

Figure 14A:
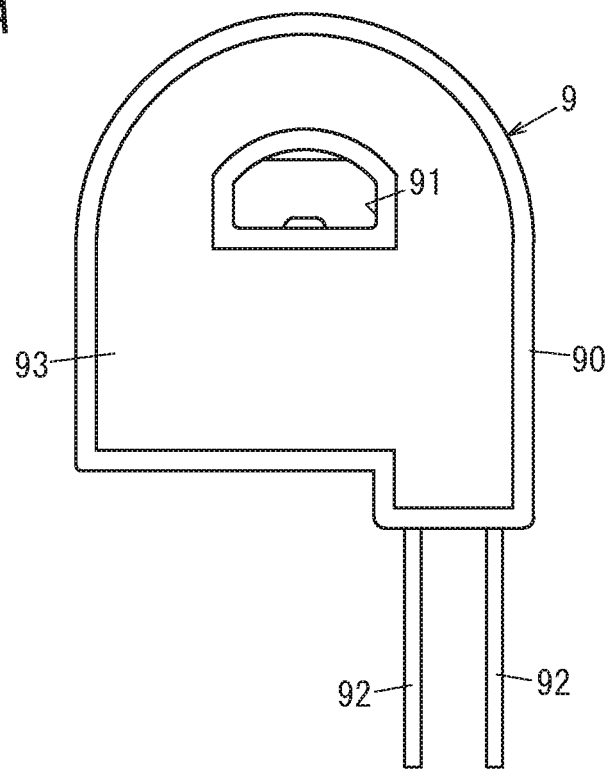
FIG. 14A is a front view of the current transformer of the power feed control device.
Figure 14B:
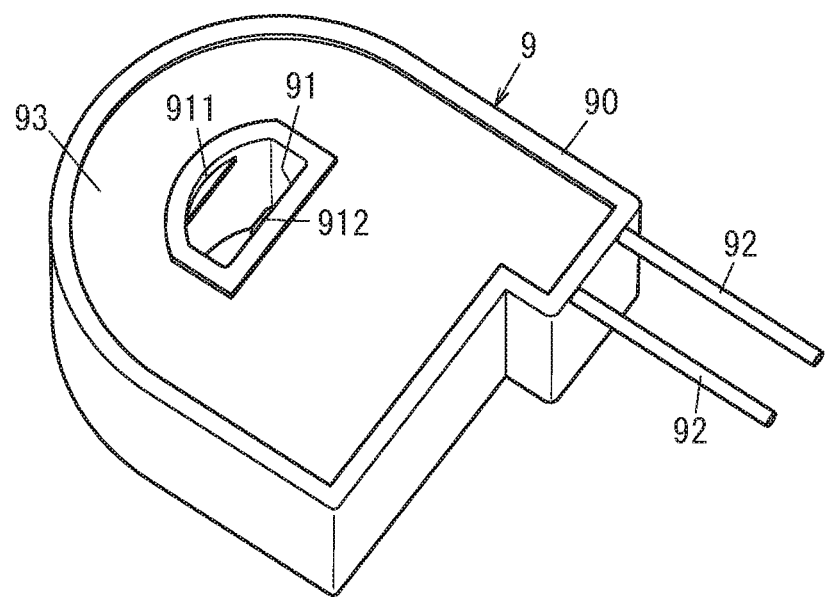
FIG. 14B is a perspective view of the current transformer of the power feed control device.

The current transformer 9 includes a through hole 91 and a pair of lead terminals 92 as shown in FIGS. 14A and 14B. More specifically, the current transformer 9 includes a case 90 with electrical insulation properties, a core arranged in the case 90, a coil arranged in the case 90 and wound around the core, and a molding portion 93 covering the coil and other members in the case 90. In addition, in the current transformer, the pair of lead terminals 92 are respectively connected one by one to both terminals of the coil. The pair of lead terminals 92 is soldered to the printed wiring board 60. The through hole 91 is cut through the case 90.

In the power feed control device 100, the respective through holes 71, 81, and 91 of the DC transformer 7, the zero-phase-sequence current transformer 8, and the current transformer 9 have mutually different shapes as shown in FIGS. 12A-14B. The respective through holes 71, 81, and 91 of the DC transformer 7, the zero-phase-sequence current transformer 8, and the current transformer 9 all have non-circular shapes. In this embodiment, two protrusions 811, 812 are provided on an inner peripheral surface of the through hole 81 of the zero-phase-sequence current transformer 8. In addition, two protrusions 911, 912 are provided on an inner peripheral surface of the through hole 91 of the current transformer 9.

In the power feed control device 100, the first surface 40a of the body 40 has a housing recess 45 (see FIG. 5A-8) for housing the module 115 (see FIGS. 3-5A, 6, 7A and 7B). This module 115 includes the sub-bus bar module 5 and the zero-phase-sequence current transformer 8. The module 115 further includes the DC transformer 7 and the current transformer 9.

Figure 6:
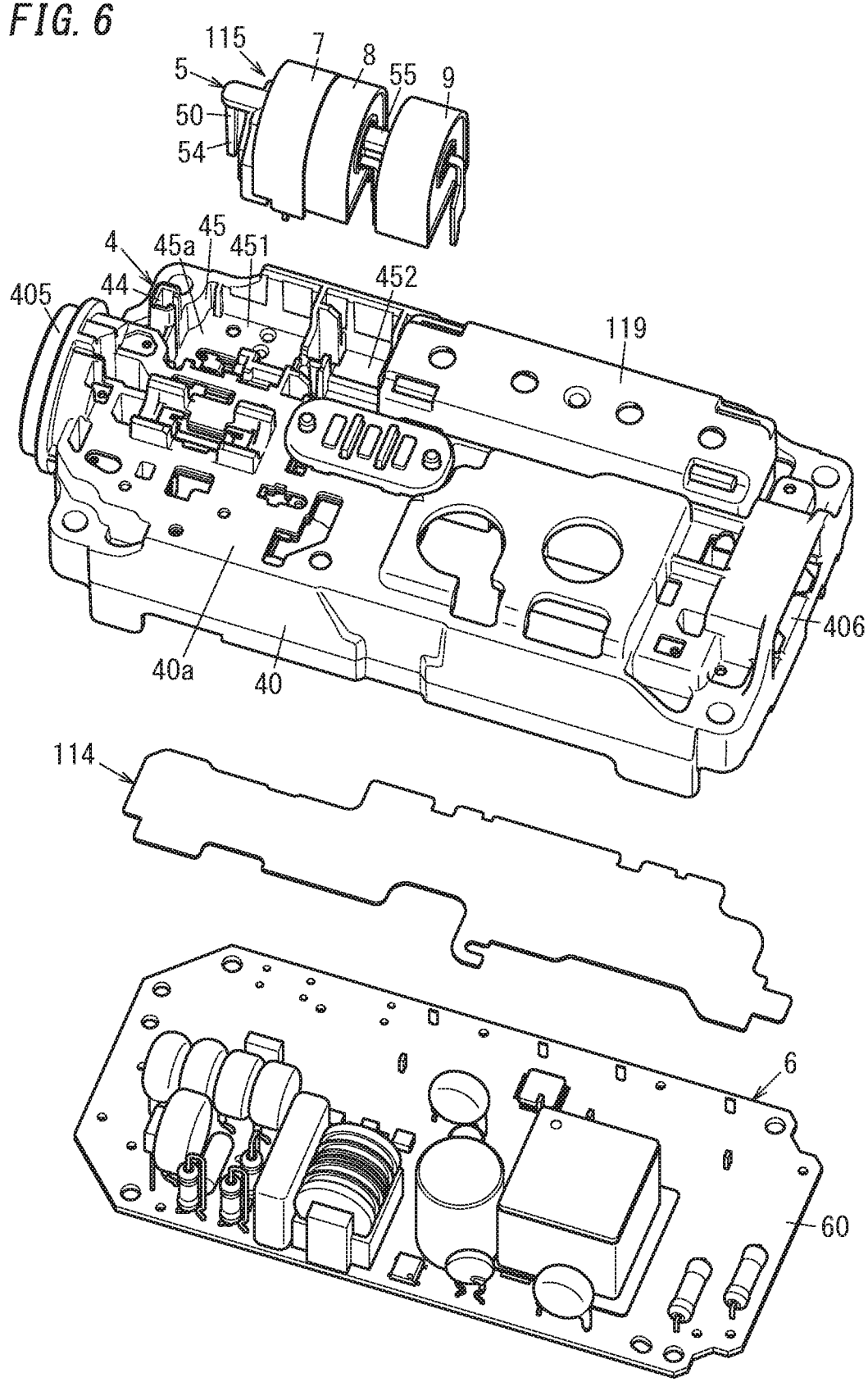
FIG. 6 is an exploded perspective view of the power feed control unit of the power feed control device.
Figure 7A:
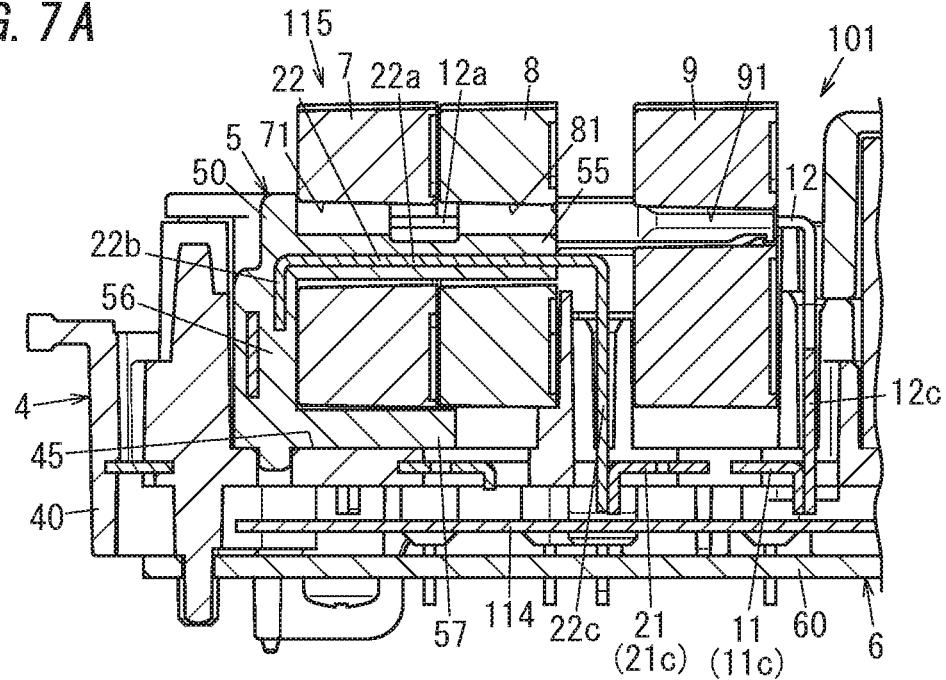
FIG. 7A is a cross-sectional view illustrating the power feed control unit of the power feed control device and taken along the plane A1-A1 shown in FIG. 5A.
Figure 7B:
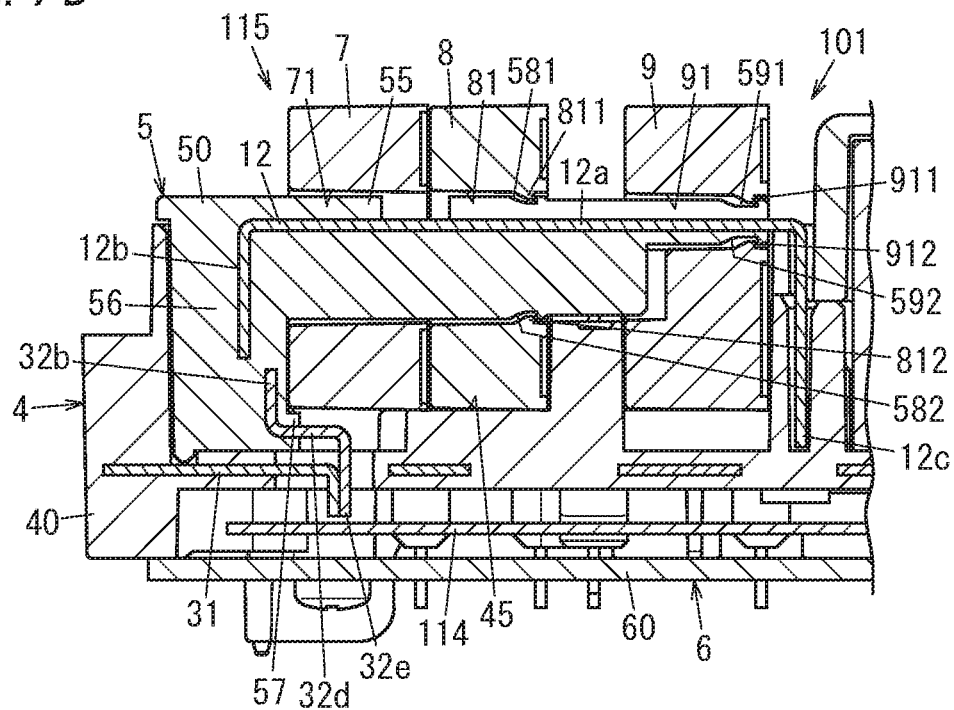
FIG. 7B is a cross-sectional view illustrating the power feed control unit of the power feed control device and taken along the plane A2-A2 shown in FIG. 5A.
Figure 8:
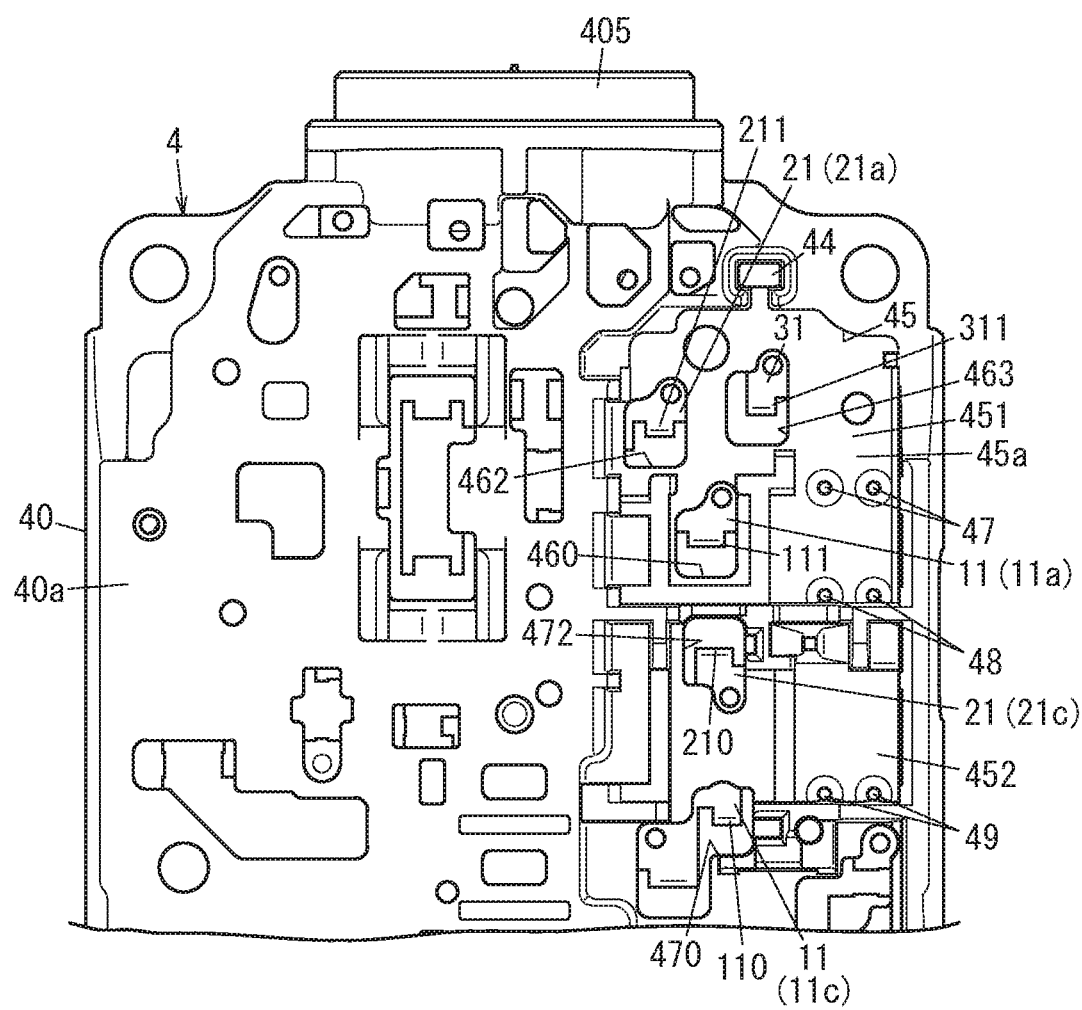
FIG. 8 is a partially cutaway front view of a bus bar module of the power feed control device.

The housing recess 45 is divided into a first housing chamber 451 for housing the DC transformer 7 and the zero-phase-sequence current transformer 8, and a second housing chamber 452 for housing the current transformer 9 as shown in FIGS. 6 and 8. The first housing chamber 451 and the second housing chamber 452 communicate with each other. The DC transformer 7, the zero-phase-sequence current transformer 8, and the current transformer 9 are secured, when housed in the housing recess 45, onto the body 40 with an adhesive. The adhesive has electrical insulation properties.

The bottom wall 45a of the housing recess 45 of the body 40 has a pair of insert holes 47 (first insert holes) to respectively pass the pair of lead terminals 72 of the DC transformer 7 (first current sensor) (see FIG. 8). In addition, the bottom wall 45a also has another pair of insert holes 48 (second insert holes) to respectively pass the pair of lead terminals 82 of the zero-phase-sequence current transformer 8 (second current sensor) (see FIG. 8). Besides, the bottom wall 45a further has still another pair of insert holes 49 (third insert holes) to respectively pass the pair of lead terminals 92 of the current transformer 9 (third current sensor) (see FIG. 8).

The holder 50 for the sub-bus bar module 5 includes a rod portion 55, a post portion 56, and an extended portion 57 as shown in FIGS. 6, 7A, 7B, and 11A-11F. The rod portion 55 covers the respective central pieces 12a, 22a, and 32a of the first sub-bus bar 12, the second sub-bus bar 22, and the third sub-bus bar 32. The rod portion 55 passes through the through hole 71 of the DC transformer 7. The post portion 56 covers the respective first leg pieces 12b, 22b, and 32b of the first sub-bus bar 12, the second sub-bus bar 22, and the third sub-bus bar 32. The extended portion 57 covers the respective extended pieces 12d, 22d, and 32d of the first sub-bus bar 12, the second sub-bus bar 22, and the third sub-bus bar 32. In the rod portion 55, the respective central pieces 22a and 32a of the second sub-bus bar 22 and the third sub-bus bar 32 are arranged so as not to be aligned with the central piece 12a of the first sub-bus bar 12 along the width of the central piece 12a. The length of the extended piece 12d of the first sub-bus bar 12 is different from the length of the respective extended pieces 22d and 32d of the second sub-bus bar 22 and the third sub-bus bar 32.

In the holder 50 for the sub-bus bar module 5, the post portion 56 has a prismatic positioning portion 54 (see FIGS. 6, 11A, 11C, and 11E), which is located opposite from the rod portion 55. Meanwhile, in the power feed control device 100, the first surface 40a of the body 40 has a recess 44 (see FIGS. 6 and 8) to which the positioning portion 54 is inserted.

In the sub-bus bar module 5, the rod portion 55 passes through the through hole 81 of the zero-phase-sequence current transformer 8. Part of the rod portion 55 passes through the through hole 81 of the zero-phase-sequence current transformer 8 to cover the respective central pieces 12a, 22a, and 32a of the first sub-bus bar 12, the second sub-bus bar 22, and the third sub-bus bar 32. Also, in the sub-bus bar module 5, the rod portion 55 passes through the through hole 91 of the current transformer 9.

In the module 115, the DC transformer 7, the zero-phase-sequence current transformer 8, and the current transformer 9 are arranged in this order on the rod portion 55 such that the DC transformer 7 is located closest to the post portion 56. In the module 115, the respective second leg pieces 22c and 32c of the second sub-bus bar 22 and the third sub-bus bar 32 are located between the zero-phase-sequence current transformer 8 and the current transformer 9. That part of the rod portion 55 to pass through the through hole 91 of the current transformer 9 covers the central piece 12a of only the first sub-bus bar 12, out of the first sub-bus bar 12, the second sub-bus bar 22, and the third sub-bus bar 32.

Parts of the rod portion 55 to pass through the respective through holes 71, 81, and 91 of the DC transformer 7, the zero-phase-sequence current transformer 8, and the current transformer 9 have mutually different shapes. The outer peripheral surface of the rod portion 55 has a pair of depressions 581 and 582 (see FIGS. 7B, 15A, 15B, and 15C) to respectively catch the pair of protrusions 811 and 812 (see FIGS. 7B and 13B) of the zero-phase-sequence current transformer 8. In addition, the outer peripheral surface of the rod portion 55 has another pair of depressions 591 and 592 (see FIGS. 7B, 15A, 15B, and 15C) to respectively catch the pair of protrusions 911 and 912 (see FIGS. 7B and 14B) of the current transformer 9.

In the module 115, when viewed from the bottom wall 45a of the housing recess 45 of the body 40, the pair of lead terminals 72 of the DC transformer 7, the pair of lead terminals 82 of the zero-phase-sequence current transformer 8, and the pair of lead terminals 92 of the current transformer 9 are located on one side with respect to the centerline 550 of the rod portion 55 along the length of the rod portion 55, while a part, covering the extended piece 12d of the first sub-bus bar 12, of the extended portion 57 is located on the other side with respect to the centerline 550 as shown in FIG. 11E.

Figure 15A:
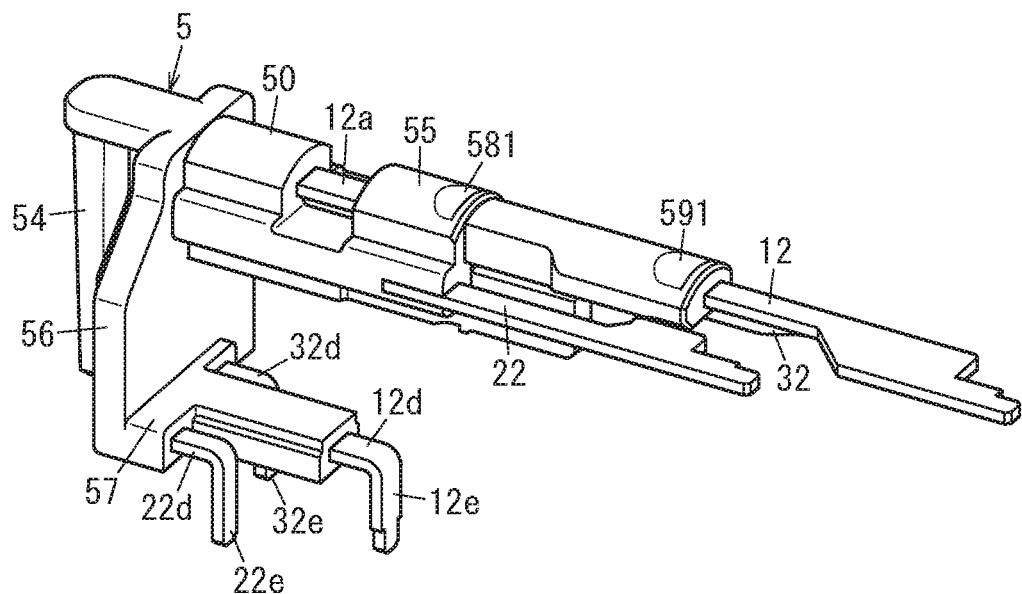
FIG. 15A is a perspective view of the sub-bus bar module of the power feed control device.
Figure 15B:
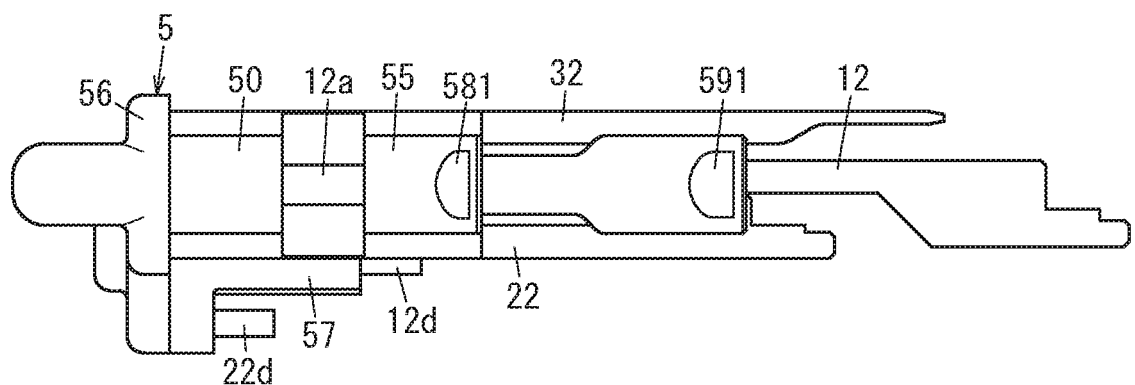
FIG. 15B is a plan view of the sub-bus bar module of the power feed control device.
Figure 15C:
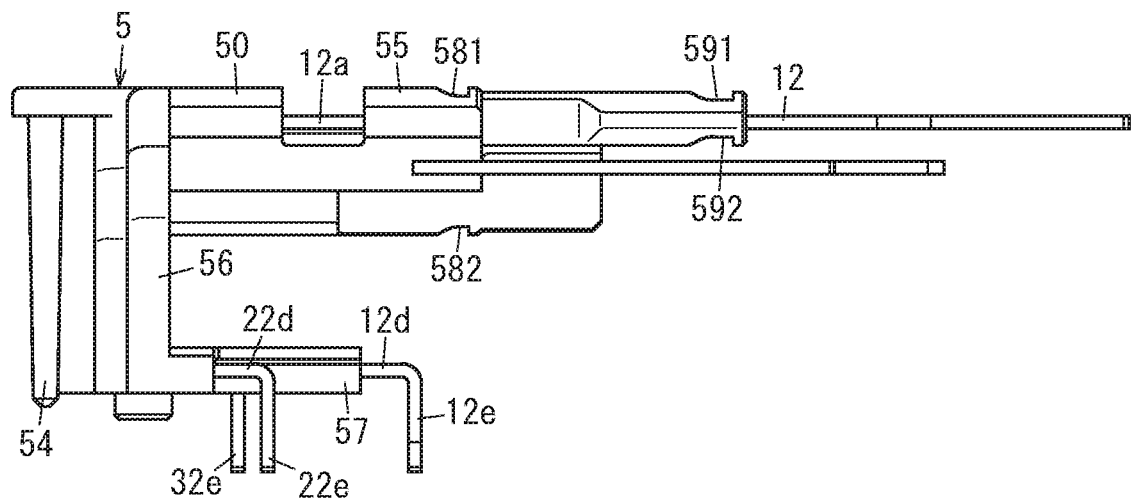
FIG. 15C is a front view of the sub-bus bar module of the power feed control device.

When the module 115 is assembled, a sub-bus bar module 5, of which the respective second leg pieces 12c, 22c, and 32c (see FIGS. 11A-11C) of the first sub-bus bar 12, the second sub-bus bar 22, and the third sub-bus bar 32 have not been bent yet, is provided as shown in FIGS. 15A-15C, for example. Thereafter, the DC transformer 7 and the zero-phase-sequence current transformer 8 are provided as shown in FIG. 16A, and then mounted onto the rod portion 55 of the holder 50 as shown in FIG. 16B. Then, the second sub-bus bar 22 and the third sub-bus bar 32 are subjected to bending to form the second leg piece 22c and the second leg piece 32c, and then the current transformer 9 is provided. Subsequently, the current transformer 9 is mounted onto the rod portion 55 and then the first sub-bus bar 12 is subjected to bending to form the second leg piece 12c.

In a known power feed control device, at least one of its DC transformer or its current transformer is stacked on its zero-phase-sequence current transformer (hereinafter referred to as a "comparative example"). In such a comparative example, the power feed control device comes to have an increased dimension along the thickness of its printed wiring board. In contrast, in the power feed control device 100 according to this embodiment, the zero-phase-sequence current transformer 8 and the DC transformer 7 may be arranged in line in one direction perpendicular to the thickness of the printed wiring board 60. This reduces an increase in the dimension of the power feed control device 100 along the thickness of the printed wiring board 60.

Nevertheless, the power feed control device 100 does not have to include, as its current sensors, all three of the zero-phase-sequence current transformer 8, the DC transformer 7, and the current transformer 9. Rather, the power feed control device 100 may include at least the zero-phase-sequence current transformer 8, out of the zero-phase-sequence current transformer 8, the DC transformer 7, and the current transformer 9, and may also include the zerophase-sequence current transformer 8 and the DC transformer 7. This selective configuration for the power feed control device 100 allows the same type of parts to be shared in common between devices with different numbers of current sensors, thus cutting down the cost eventually. Optionally, the DC transformer 7 and the zero-phase-sequence current transformer 8 may change their positions with each other. In that case, however, the shapes of the respective cases 70 and 80 of the DC transformer 7 and the zero-phase-sequence current transformer 8 are suitably exchanged with each other, and the pair of lead terminals 72 of the DC transformer 7 suitably changes positions with the pair of lead terminals 82 of the zero-phase-sequence current transformer 8.

Optionally, the power feed control device 100 may further include a fuse forming part of the first electrical path 1, for example. In that case, in the power feed control device 100, a portion of the first power-side bus bar 11*a* of the bus bar module 4 may be cut out, and the fuse may be provided in the cutout portion, and the body 40 may include a housing portion to house the fuse. Alternatively, instead of providing such a fuse for the first electrical path 1, the power feed control device 100 may include a fuse forming part of the second electrical path 2. In that case, in the power feed control device 100, a portion of the second power-side bus bar 21*a* of the bus bar module 4 may be cut out, and the fuse may be provided in the cutout portion, and the body 40 may include a housing portion to house the fuse.

As can be seen from the foregoing description of embodiments, a power feed control device 100 according to a first aspect includes a first electrical path 1 provided for a hot pole, a second electrical path 2 provided for a neutral pole, and a third electrical path 3 provided for a grounding pole. The first electrical path 1 includes a first bus bar 11, a first sub-bus bar 12, and a first contact device S1 which are electrically connected together. The second electrical path 2 includes a second bus bar 21, a second sub-bus bar 22, and a second contact device S2 which are electrically connected together. The power feed control device 100 further includes a third sub-bus bar 32, a body 40, a holder 50, a zero-phase-sequence current transformer 8, and a control circuit 10. The third sub-bus bar 32 is electrically connected to the third electrical path 3. The body 40 has electrical insulation properties. The body 40 holds the first bus bar 11 and the second bus bar 21. The holder 50 has electrical insulation properties and holds the first sub-bus bar 12, the second sub-bus bar 22, and the third sub-bus bar 32. The zero-phase-sequence current transformer 8 has a through hole 81. The control circuit 10 controls the first contact device S1 and the second contact device S2 in accordance with an output signal of the zero-phase-sequence current transformer 8. The first sub-bus bar 12, the second sub-bus bar 22, and the third sub-bus bar 32 each include a central piece 12*a*, 22*a*, 32*a*, a first leg piece 12*b*, 22*b*, 32*b*, a second leg piece 12*c*, 22*c*, 32*c*, an extended piece 12*d*, 22*d*, 32*d*, and a lead piece 12*e*, 22*e*, 32*e*. The central piece 12*a*, 22*a*, and 32*a* has an elongated shape. The first leg piece 12*b*, 22*b*, 32*b* and the second leg piece 12*c*, 22*c*, 32*c* respectively protrude, along thickness of the central piece 12*a*, 22*a*, and 32*a*, from a first longitudinal end and a second longitudinal end of the central piece 12*a*, 22*a*, and 32*a*. The extended piece 12*d*, 22*d*, 32*d* protrudes from a tip of the first leg piece 12*b*, 22*b*, 32*b* along thickness of the first leg piece 12*b*, 22*b*, 32*b*. The lead piece 12*e*, 22*e*, 32*e* protrudes from a tip of the extended piece 12*d*, 22*d*, 32*d* so as to face away from the central piece 12*a*, 22*a*, 32*a*. The body 40 includes a housing recess 45 to house a module 115. The module 115 includes the holder 50, the first sub-bus bar 12, the second sub-bus bar 22, the third sub-bus bar 32, and the zero-phase-sequence current transformer 8. Lengths of the respective extended pieces 12*d*, 22*d*, and 32*d* of the first sub-bus bar 12, the second sub-bus bar 22, and the third sub-bus bar 32 are different from each other. The holder 50 includes a rod portion 55, a post portion 56, and an extended portion 57. The rod portion 55 covers the respective central pieces 12*a*, 22*a*, and 32*a* of the first sub-bus bar 12, the second sub-bus bar 22, and the third sub-bus bar 32 and passes through the through hole 81 of the zero-phase-sequence current transformer 8. The post portion 56 covers the respective first leg pieces 12*b*, 22*b*, and 32*b* of the first sub-bus bar 12, the second sub-bus bar 22, and the third sub-bus bar 32. The extended portion 57 covers the respective extended pieces 12*d*, 22*d*, and 32*d* of the first sub-bus bar 12, the second sub-bus bar 22, and the third sub-bus bar 32.

The power feed control device 100 according to the first aspect improves electrical insulation properties between the respective lead pieces 12*e*, 22*e*, and 32*e* of the first sub-bus bar 12, the second sub-bus bar 22, and the third sub-bus bar 32. That is to say, compared to a situation where the respective lead pieces 12*e*, 22*e*, and 32*e* of the first, second, and third sub-bus bars 12, 22, and 32 are located within a projection area of the through hole 81 of the zero-phase-sequence current transformer 8, the power feed control device 100 according to the first aspect allows the creepage distance for insulation between the respective lead pieces 12*e*, 22*e*, and 32*e* of the first, second, and third sub-bus bars 12, 22, and 32 to be increased, thus improving electrical insulation properties between them.

A power feed control device 100 according to a second aspect, which may be implemented in conjunction with the first aspect, further includes a printed wiring board 60 provided with the control circuit 10. The body 40 has a first surface 40*a* and second surface 40*b* forming two opposite surfaces of the body 40 along a thickness thereof. The zero-phase-sequence current transformer 8 includes a pair of lead terminals 82. The printed wiring board 60 is arranged to face the second surface 40*b* of the body 40. The housing recess 45 is formed on the first surface 40*a* of the body 40. The body 40 has a pair of insert holes 48 cut through a bottom wall 45*a* of the housing recess 45 to respectively pass a pair of lead terminals 82 of the zero-phase-sequence current transformer 8. The pair of lead terminals 82 of the zero-phase-sequence current transformer 8 is connected to the printed wiring board 60. Thus, the power feed control device 100 according to the second aspect facilitates connection of the zero-phase-sequence current transformer 8 to the printed wiring board 60.

A power feed control device 100 according to a third aspect, which may be implemented in conjunction with the second aspect, further includes a DC transformer 7. The DC transformer 7 has a through hole 71 and a pair of lead terminals 72. The control circuit 10 is configured to control the first contact device S1 and the second contact device S2 in accordance with an output signal of the DC transformer 7. The rod portion 55 passes through the through hole 71 of the DC transformer 7. Part of the rod portion 55 passes through the through hole 71 of the DC transformer 7 to cover the respective central pieces 12*a*, 22*a*, and 32*a* of the first sub-bus bar 12, the second sub-bus bar 22, and the third sub-bus bar 32. The body 40 has a pair of insert holes 47 cut through the bottom wall 45*a* of the housing recess 45 to respectively pass the pair of lead terminals 72 of the DC transformer 7. The pair of lead terminals 72 of the DC transformer 7 is connected to the printed wiring board 60.

This allows the power feed control device 100 according to the third aspect to make the control circuit 10 perform control in accordance with the output signal of the DC transformer 7 and to arrange the zero-phase-sequence current transformer 8 and the DC transformer 7 in line in one direction perpendicular to the thickness of the printed wiring board 60.

A power feed control device 100 according to a fourth aspect, which may be implemented in conjunction with the third aspect, further includes a current transformer 9. The current transformer 9 has a through hole 91 and a pair of lead terminals 92. The control circuit 10 is configured to control the first contact device S1 and the second contact device S2 in accordance with an output signal of the current transformer 9. The rod portion 55 passes through the through hole 91 of the current transformer 9. In the rod portion 55, the DC transformer 7, the zero-phase-sequence current transformer 8, and the current transformer 9 are arranged in this order such that the DC transformer 7 is located closest to the post portion 56. The respective second leg pieces 22c and 32c of the second sub-bus bar 22 and the third sub-bus bar 32 are located between the zero-phase-sequence current transformer 8 and the current transformer 9. Part of the rod portion 55 passes through the through hole 91 of the current transformer 9 to cover the central piece 12a of only the first sub-bus bar 12, out of the first sub-bus bar 12, the second sub-bus bar 22, and the third sub-bus bar 32. The body 40 has a pair of insert holes 49 cut through the bottom wall 45a of the housing recess 45 to respectively pass the pair of lead terminals 92 of the current transformer 9. The pair of lead terminals 92 of the current transformer 9 is connected to the printed wiring board 60. This allows the power feed control device 100 according to the fourth aspect to make the control circuit 10 perform control in accordance with the output signal of the current transformer 9 and to arrange the DC transformer 7, the zero-phase-sequence current transformer 8, and the current transformer 9 in line in one direction perpendicular to the thickness of the printed wiring board 60.

In a power feed control device 100 according to a fifth aspect, which may be implemented in conjunction with the fourth aspect, the respective through holes 71, 81, and 91 of the DC transformer 7, the zero-phase-sequence current transformer 8, and the current transformer 9 have mutually different shapes. Parts of the rod portion 55, passing through the respective through holes 71, 81, and 91 of the DC transformer 7, the zero-phase-sequence current transformer 8, and the current transformer 9, have mutually different shapes. This allows the power feed control device 100 according to the fifth aspect to reduce the chances of arranging the DC transformer 7, the zero-phase-sequence current transformer 8, and the current transformer 9 at wrong positions with respect to the rod portion 55 during the assembling process of the module 115.

In a power feed control device 100 according to a sixth aspect, which may be implemented in conjunction with the fifth aspect, the respective through holes 71, 81, and 91 of the DC transformer 7, the zero-phase-sequence current transformer 8, and the current transformer 9 have non-circular shapes. This allows the power feed control device 100 according to the sixth aspect to reduce the chances of the DC transformer 7, the zero-phase-sequence current transformer 8, and the current transformer 9 rotating around the rod portion 55.

In a power feed control device 100 according to a seventh aspect, which may be implemented in conjunction with any one of the fourth to sixth aspects, a protrusion 811, 812 is provided on an inner peripheral surface of the through hole 81 of the zero-phase-sequence current transformer 8, and an outer peripheral surface of the rod portion 55 has a depression 581, 582 to catch the protrusion 811, 812. This allows the power feed control device 100 according to the seventh aspect to improve the positioning accuracy of the zero-phase-sequence current transformer 8.

In a power feed control device 100 according to an eighth aspect, which may be implemented in conjunction with any one of the fourth to seventh aspects, when viewed from the bottom wall 45a of the housing recess 45 of the body 40, the respective pairs of lead terminals 72, 82, and 92 of the DC transformer 7, the zero-phase-sequence current transformer 8, and the current transformer 9 are located on one side with respect to a centerline 550 of the rod portion 55 along length thereof, and the part, covering the extended piece 12d of the first sub-bus bar 12, of the extended portion 57 is located on the other side with respect to the centerline 550. This allows the power feed control device 100 according to the eighth aspect to prevent the DC transformer 7, the zero-phase-sequence current transformer 8, and the current transformer 9 from being passed in reverse direction with respect to the rod portion 55.

REFERENCE SIGNS LIST

100 Power Feed Control Device
1 First Electrical Path
11 First Bus Bar
12 First Sub-Bus Bar
12a Central Piece
12b First Leg Piece
12c Second Leg Piece
12d Extended Piece
12e Lead Piece
2 Second Electrical Path
21 Second Bus Bar
22 Second Sub-Bus Bar
22a Central Piece
22b First Leg Piece
22c Second Leg Piece
22d Extended Piece
22e Lead Piece
3 Third Electrical Path
32 Third Sub-Bus Bar
32a Central Piece
32b First Leg Piece
32c Second Leg Piece
32d Extended Piece
32e Lead Piece
115 Module
40 Body
40a First Surface
40b Second Surface
45 Housing Recess
45a Bottom Wall
47 Insert Hole
48 Insert Hole
49 Insert Hole
50 Holder
55 Rod Portion
550 Centerline
56 Post Portion
57 Extended Portion
581 Depression
582 Depression
7 DC Transformer 71 Through Hole
72 Lead Terminal
8 Zero-Phase-Sequence Current Transformer
81 Through Hole
811 Protrusion
812 Protrusion
82 Lead Terminal
9 Current Transformer
91 Through Hole
911 Protrusion
912 Protrusion
92 Lead Terminal
S1 First Contact Device
S2 Second Contact Device

The invention claimed is:

1. A power feed control device comprising:
a first electrical path provided for a hot pole and including a first bus bar, a first sub-bus bar, and a first contact device which are electrically connected together;
a second electrical path provided for a neutral pole and including a second bus bar, a second sub-bus bar, and a second contact device which are electrically connected together;
a third electrical path provided for a grounding pole;
a third sub-bus bar electrically connected to the third electrical path;
a body having electrical insulation properties and configured to hold the first bus bar and the second bus bar;
a holder having electrical insulation properties and configured to hold the first sub-bus bar, the second sub-bus bar, and the third sub-bus bar;
a zero-phase-sequence current transformer having a through hole; and
a control circuit configured to control the first contact device and the second contact device in accordance with an output signal of the zero-phase-sequence current transformer,
the first sub-bus bar, the second sub-bus bar, and the third sub-bus bar each including:
a central piece having an elongated shape;
a first leg piece and a second leg piece configured to respectively protrude, along thickness of the central piece, from a first longitudinal end and a second longitudinal end of the central piece;
an extended piece configured to protrude from a tip of the first leg piece along thickness of the first leg piece; and
a lead piece configured to protrude from a tip of the extended piece so as to face away from the central piece, the body including:
a housing recess configured to house a module including the holder, the first sub-bus bar, the second sub-bus bar, the third sub-bus bar, and the zero-phase-sequence current transformer,
lengths of the respective extended pieces of the first sub-bus bar, the second sub-bus bar, and the third sub-bus bar being different from each other, the holder including:
a rod portion configured to cover the respective central pieces of the first sub-bus bar, the second sub-bus bar, and the third sub-bus bar and to pass through the through hole of the zero-phase-sequence current transformer;
a post portion configured to cover the respective first leg pieces of the first sub-bus bar, the second sub-bus bar, and the third sub-bus bar; and
an extended portion configured to cover the respective extended pieces of the first sub-bus bar, the second sub-bus bar, and the third sub-bus bar.

2. The power feed control device of claim 1, further comprising a printed wiring board provided with the control circuit, wherein
the body has a first surface and second surface forming two opposite surfaces of the body along a thickness thereof,
the zero-phase-sequence current transformer includes a pair of lead terminals,
the printed wiring board is arranged to face the second surface of the body,
the housing recess is formed on the first surface of the body,
the body has a pair of insert holes cut through a bottom wall of the housing recess to respectively pass the pair of lead terminals of the zero-phase-sequence current transformer, and
the pair of lead terminals of the zero-phase-sequence current transformer is connected to the printed wiring board.

3. The power feed control device of claim 2, further comprising a DC transformer having a through hole and a pair of lead terminals, wherein
the control circuit is configured to control the first contact device and the second contact device in accordance with an output signal of the DC transformer,
the rod portion is configured to pass through the through hole of the DC transformer,
part of the rod portion is configured to pass through the through hole of the DC transformer and cover the respective central pieces of the first sub-bus bar, the second sub-bus bar, and the third sub-bus bar,
the body has a pair of insert holes cut through the bottom wall of the housing recess to respectively pass the pair of lead terminals of the DC transformer, and
the pair of lead terminals of the DC transformer is connected to the printed wiring board.

4. The power feed control device of claim 3, further comprising a current transformer having a through hole and a pair of lead terminals, wherein
the control circuit is configured to control the first contact device and the second contact device in accordance with an output signal of the current transformer,
the rod portion is configured to pass through the through hole of the current transformer,
in the rod portion, the DC transformer, the zero-phase-sequence current transformer, and the current transformer are arranged in this order such that the DC transformer is located closest to the post portion,
the respective second leg pieces of the second sub-bus bar and the third sub-bus bar are located between the zero-phase-sequence current transformer and the current transformer,
part of the rod portion is configured to pass through the through hole of the current transformer and cover the central piece of only the first sub-bus bar, out of the first sub-bus bar, the second sub-bus bar, and the third sub-bus bar,
the body has a pair of insert holes cut through the bottom wall of the housing recess to respectively pass the pair of lead terminals of the current transformer, and
the pair of lead terminals of the current transformer is connected to the printed wiring board.

5. The power feed control device of claim 4, wherein
the respective through holes of the DC transformer, the zero-phase-sequence current transformer, and the current transformer have mutually different shapes, and
the parts of the rod portion, passing through the respective through holes of the DC transformer, the zero-phase-sequence current transformer, and the current transformer, have mutually different shapes.

6. The power feed control device of claim 5, wherein
the respective through holes of the DC transformer, the zero-phase-sequence current transformer, and the current transformer have non-circular shapes.

7. The power feed control device of claim 4, wherein
a protrusion is provided on an inner peripheral surface of the through hole of the zero-phase- sequence current transformer, and
an outer peripheral surface of the rod portion has a depression configured to catch the protrusion.

8. The power feed control device of claim 4, wherein
when viewed from the bottom wall of the housing recess of the body, the respective pairs of lead terminals of the DC transformer, the zero-phase-sequence current transformer, and the current transformer are located on one side with respect to a centerline of the rod portion along length thereof, and the part, covering the extended piece of the first sub-bus bar, of the extended portion is located on the other side with respect to the centerline.

9. The power feed control device of claim 5, wherein
a protrusion is provided on an inner peripheral surface of the through hole of the zero-phase-sequence current transformer, and
an outer peripheral surface of the rod portion has a depression configured to catch the protrusion.

10. The power feed control device of claim 6, wherein
a protrusion is provided on an inner peripheral surface of the through hole of the zero-phase-sequence current transformer, and
an outer peripheral surface of the rod portion has a depression configured to catch the protrusion.

11. The power feed control device of claim 5, wherein
when viewed from the bottom wall of the housing recess of the body, the respective pairs of lead terminals of the DC transformer, the zero-phase-sequence current transformer, and the current transformer are located on one side with respect to a centerline of the rod portion along length thereof, and the part, covering the extended piece of the first sub-bus bar, of the extended portion is located on the other side with respect to the centerline.

12. The power feed control device of claim 6, wherein
when viewed from the bottom wall of the housing recess of the body, the respective pairs of lead terminals of the DC transformer, the zero-phase-sequence current transformer, and the current transformer are located on one side with respect to a centerline of the rod portion along length thereof, and the part, covering the extended piece of the first sub-bus bar, of the extended portion is located on the other side with respect to the centerline.

13. The power feed control device of claim 7, wherein
when viewed from the bottom wall of the housing recess of the body, the respective pairs of lead terminals of the DC transformer, the zero-phase-sequence current transformer, and the current transformer are located on one side with respect to a centerline of the rod portion along length thereof, and the part, covering the extended piece of the first sub-bus bar, of the extended portion is located on the other side with respect to the centerline.

14. The power feed control device of claim 9, wherein
when viewed from the bottom wall of the housing recess of the body, the respective pairs of lead terminals of the DC transformer, the zero-phase-sequence current transfoinier, and the current transformer are located on one side with respect to a centerline of the rod portion along length thereof, and the part, covering the extended piece of the first sub-bus bar, of the extended portion is located on the other side with respect to the centerline.

15. The power feed control device of claim 10, wherein
when viewed from the bottom wall of the housing recess of the body, the respective pairs of lead terminals of the DC transformer, the zero-phase-sequence current transformer, and the current transformer are located on one side with respect to a centerline of the rod portion along length thereof, and the part, covering the extended piece of the first sub-bus bar, of the extended portion is located on the other side with respect to the centerline.

* * * * *